(12) United States Patent
Kern et al.

(10) Patent No.: US 8,898,535 B2
(45) Date of Patent: Nov. 25, 2014

(54) APPARATUS AND METHOD FOR DETECTING AN ERROR WITHIN A CODED BINARY WORD

(75) Inventors: Thomas Kern, Munich (DE); Ulrich Backhausen, Taufkirchen (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 394 days.

(21) Appl. No.: 12/959,838

(22) Filed: Dec. 3, 2010

(65) Prior Publication Data

US 2012/0144260 A1 Jun. 7, 2012

(51) Int. Cl.
*H03M 13/00* (2006.01)
*H03M 13/37* (2006.01)
*H03M 13/13* (2006.01)
*H03M 13/19* (2006.01)

(52) U.S. Cl.
CPC ...... *H03M 13/3776* (2013.01); *H03M 13/3738* (2013.01); *H03M 13/13* (2013.01); *H03M 13/19* (2013.01)
USPC .......................................................... 714/752

(58) Field of Classification Search
USPC .......................................... 714/755, E11.032
See application file for complete search history.

(56) References Cited

U.S. PATENT DOCUMENTS

| | | | | |
|---|---|---|---|---|
| 7,203,890 | B1* | 4/2007 | Normoyle | 714/768 |
| 8,069,392 | B1* | 11/2011 | Norrie | 714/758 |
| 2002/0120901 | A1* | 8/2002 | Poirier et al. | 714/752 |
| 2003/0070135 | A1* | 4/2003 | Murillo | 714/785 |
| 2006/0069977 | A1* | 3/2006 | Maeda et al. | 714/752 |
| 2007/0130496 | A1* | 6/2007 | Kanno | 714/763 |
| 2007/0277070 | A1* | 11/2007 | Janke et al. | 714/736 |
| 2010/0122138 | A1* | 5/2010 | Nishio et al. | 714/752 |
| 2010/0223525 | A1* | 9/2010 | Wuu et al. | 714/755 |

OTHER PUBLICATIONS

U.S. Appl. No. 12/959,817, filed on Dec. 3, 2010.
Lin, Shu. "Error Control Coding—Fundamentals and Applications". Prentice-Hall, Inc. Englewood Cliffs, New Jersey. pp. 79-82.
Fujiwara, Eiji. "Code Design for Dependable Systems—Theory and Practical Applications." Wiley-Interscience Publication. pp 98-101.
Micheloni, R. et al. "Error Correction Codes for Non-Volatile Memories." Springer Publishing. pp 48-55.
Micheloni, R. et al. "Error Correction Codes for Non-Volatile Memories." Springer Publishing. pp. 38-43.
Goessel, Michael, et al. "New Method of Concurrent Checking." Springer Publishing. pp. 31-33.
MPC 5604P "Microcontroller Reference Manual for Freescale Semiconductor." 82 Pages.
Office Action dated Jan. 17, 2013 for U.S. Appl. No. 12/959,817.
Office Action dated Jun. 5, 2013 for U.S. Appl. No. 12/959,817.

* cited by examiner

*Primary Examiner* — Ajay Bhatia
*Assistant Examiner* — Thien D Nguyen
(74) *Attorney, Agent, or Firm* — Eschweiler & Associates, LLC

(57) ABSTRACT

An apparatus for detecting an error within a coded binary word includes an error corrector and an error detector. The error corrector corrects a correctable bit error within a faulty subset of bits of a faulty coded binary word coded by an error correction code, so that the corrected subset of bits is equal to a corresponding subset of bits of a code word of the error correction code, if the error corrector works faultlessly. Further, the error detector determines an error detection bit sequence indicating whether or not an error detector input binary word is a code word of the error correction code. The error detector input binary word is based on a corrected coded binary word containing the corrected subset of bits and maximally a proper subset of bits of the faulty coded binary word.

24 Claims, 10 Drawing Sheets

APPARATUS AND METHOD FOR DETECTING AN ERROR WITHIN A CODED BINARY WORD

REFERENCE TO RELATED APPLICATION

This application is related to U.S. patent application Ser. No. 12/959,817 filed on Dec. 3, 2010.

FIELD

Embodiments relate to error correction and error detection of digital signals and particularly to an apparatus and a method for detecting an error within a coded binary word and an apparatus and a method for detecting an error within a plurality of coded binary words coded by an error correction code.

BACKGROUND

For the correction of data encoded with error correction codes, error correction circuits are used. As codes for error correction, frequently Hamming-Codes, Hsiao-Codes, BCH-Codes and others are used. For the error correction of data encoded with error-correcting codes, error correction circuits may be used.

By the high degree of integration of electronic circuits, more frequently transient and permanent hardware errors occur which may also corrupt the error correction circuit. An erroneous error correction circuit may lead to an erroneous correction of the data to be processed by the same, even if the data to be processed by the same are correct, which is disadvantageous and ought to be practically excluded, for example, in safety-critical applications.

SUMMARY

An embodiment according to an aspect provides an apparatus for detecting an error within a coded binary word comprising an error corrector and an error detector. The error corrector is configured to correct a correctable bit error within a faulty subset of bits of a faulty coded binary word coded by an error correction code, so that the corrected subset of bits is equal to a corresponding subset of bits of a code word of the error correction code, if the error corrector works faultlessly. Further, the error detector is configured to determine an error detection bit sequence indicating whether or not an error detector input binary word is a code word of the error correction code. The error detector input binary word is based on a corrected coded binary word containing the corrected subset of bits and maximally a proper subset of bits of the faulty coded binary word.

By determining whether or not the error detector input binary word is a code word of the error correction code an error within the error detector input binary word can be detected. This error may be caused by a faulty error correction performed by the error corrector or an error within the proper subset of bits of the faulty coded binary word not corrected by the error corrector.

Another embodiment according to an aspect provides an error detector configured to determine an error detection bit sequence indicating whether or not an error detector input binary word is a code word of an error correction code. The error detector may determine the error detection bit sequence based on a multiplication of an error detection matrix and the error detector input binary word. The error detection matrix is based on a check matrix of the error correction code. Further, the error detection matrix comprises less rows than the check matrix or less columns than the check matrix.

A further embodiment according to an aspect provides an error detector configured to determine an error detection bit sequence indicating whether or not an error detector input binary word is a code word of an error correction code. The error detector determines the error detection bit sequence based on a multiplication of an error detection matrix and the error detection input binary word. Further, the error detection matrix is based on the check matrix of the error correction code and the error detection matrix comprises at least one column or at least one row derived by inverting at least one element of a corresponding column or at least one element of a corresponding row of the check matrix.

Another embodiment according to another aspect provides an apparatus for detecting an error within the plurality of coded binary words coded by an error correction code comprising a combiner and an error detector. The combiner is configured to determine a combined binary word by combining a first coded binary word and a second coded binary word of the plurality of coded binary words, so that the determined combined binary word is a code word of the error correction code, if the first coded binary word and the second coded binary word are code words of the error correction code, and so that the determined combined coded binary word is no code word of the error correction code, if the first coded binary word or the second coded binary word is no code word of the error correction code. Further, the error detector is configured to determine an error detection bit sequence indicating whether or not the determined combined binary word is a code word of the error correction code.

By combining two or more coded binary words in a way, so that the combined binary word is again a code word of the error correction code if all combined coded binary words are code words of the error correction code, it may be sufficient to use the same error detector for detecting an error within two or more coded binary words simultaneously. Therefore, for example, only one error detector is required for detecting an error within a plurality of binary words coded by an error correction code. In this way, the hardware efforts for the error detection can be significantly reduced.

BRIEF DESCRIPTION OF THE DRAWINGS

Embodiments will be detailed subsequently referring to the appended drawings, in which.

DETAILED DESCRIPTION

Figure 1:
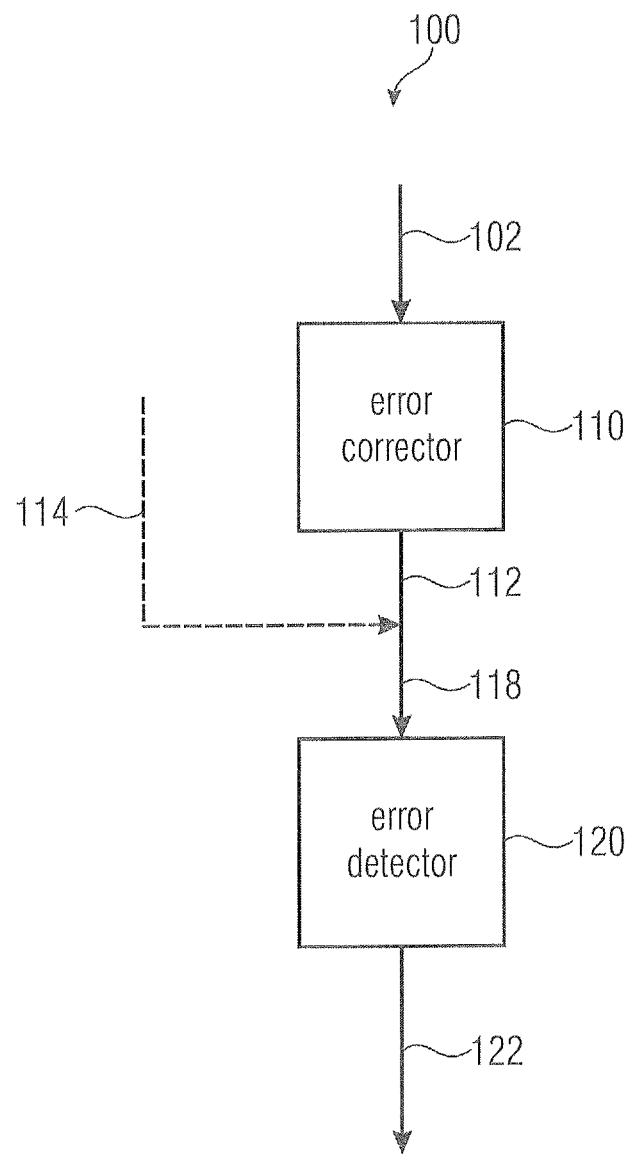
FIG. 1 is a block diagram of an apparatus for detecting an error within a coded binary word.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of an apparatus 100 for detecting an error within a coded binary word according to an embodiment of an aspect. The apparatus 100 comprises an error corrector 110 connected to an error detector 120. The error corrector 110 corrects a correctable bit error 102 within a faulty subset of bits of a faulty coded binary word coded by an error correction code, so that the corrected subset of bits is equal to a corresponding subset of bits of a code word of the error correction code, if the error corrector 110 works faultlessly. Further, the error detector 120 determines an error detection bit sequence 122 indicating whether or not an error detector input binary word 118 is a code word of the error correction code. The error detector input binary word 118 is based on a corrected coded binary word 112 containing the corrected subset of bits and maximally a proper subset of bits of the faulty coded binary word 102.

By determining whether or not the error detector input binary word 118 is a code word of the error correction code, an error caused by the error corrector and/or an error already existing in the proper subset of bits of the faulty coded binary word 102 contained by the corrected coded binary word 112 can be detected. Therefore, the probability of an error within a coded binary word after error correction can be significantly reduced, so that the overall error detection probability can be significantly improved.

In this example and in the following examples, a binary word comprises the same number of bits as a code word of the error correction code. A subset of bits of a binary word or a code word may be an empty subset, may contain some bits of the binary word or the code word or may contain all bits of the binary word or the code word. Further, a proper subset of a binary word or a code word may be an empty subset or may contain some bits, but not all bits, of the binary word or the code word.

The error corrector 110 may be implemented so that a correctable bit error within all bits of a coded binary word can be corrected or so that only a part of the bits of a coded binary word provided to the error corrector 110 is corrected. For example, a coded binary word may comprise address bits, which may not be corrected and therefore, the hardware efforts for the error corrector 110 can be reduced. In this example, a correctable bit error may only be corrected in a faulty proper subset of bits if a faulty coded binary word is provided to the error corrector 110.

In other words, the faulty subset of bits of the faulty binary word may contain all bits of the faulty coded binary word 102 or the faulty subset of bits may be a proper subset of the bits of the faulty coded binary word 102 and contains not all bits of the faulty coded binary word 102.

For example, the faulty coded binary word 102 contains 20 bits and the faulty subset of bits contains the first 14 bits of the faulty coded binary word 102 with at least one faulty bit. Then, the error corrector 110 corrects a correctable bit error (e.g. the at least one faulty bit) within the 14 bits of the faulty subset of bits, while a correctable bit error within the last 6 bits of the faulty coded binary word 102, which are not contained by the faulty subset of bits, is not corrected by the error corrector 110, if it works faultlessly. If the faulty subset of bits contains all 20 bits of the faulty coded binary word 102, each correctable bit error is corrected by the error corrector 110. If a faultless coded binary word is provided to the error corrector, none of the 14 bits of subset of bits (which is in that case no "faulty" subset) is corrected and the corrected subset of bits is equal to the 14 bits of the faultless coded binary word.

The corrected subset of bits contains the same number of bits as the faulty subset of bits, but at least one bit may be corrected by the error corrector 110 based on the error correction code, if the faulty subset comprises a correctable bit error. The corrected subset of bits corresponds to a subset of bits of a code word of the error correction code, which is a result of the correction of the correctable bit error, if the error corrector 110 works faultlessly. Otherwise, the error corrector 110 may output a faulty corrected subset of bits containing at least one faulty bit. Such a faulty behavior of the error corrector 110 can be detected by the error detector 120.

The input of the error corrector 110 may be all bits of a coded binary word, since all bits may be necessary for the error correction based on the error correction code. The input coded binary word is a faulty coded binary word, if it comprises at least one faulty bit. The corrected subset of bits, which represents the output of the error corrector 110, may comprise less bits than the input coded binary word depending on whether the error corrector 110 corrects a correctable bit error within all bits of a faulty coded binary word or only within a faulty proper subset of bits of the faulty coded binary word.

The error detector 120 determines an error detection bit sequence 122 indicating whether or not an error detector input binary word 118 is a code word of the error correction code. For example, the error detector 120 may determine the error detection bit sequence 122 based on the error correction code, so that the error detection bit sequence may represent an error syndrome of the error detector input binary word 118. In this example, the error detection bit sequence 102 may comprise a number of bits equal to the number of check bits of the error correction code. In this way, each detectable error (depending on the error correction code) may be detected by the error detector 120 (if the error detector works faultlessly).

Alternatively, for example, the error detector 120 may determine the error detection bit sequence 122, so that the error detection bit sequence 102 represents only a reduced error syndrome (e.g. a subset of bits of the error syndrome or a function of the bits of the error syndrome as for example the parity of all bits of the error syndrome) of the error detector input binary word 118 resulting in a reduced error detection probability, but also reduced hardware requirements for the error detector 120. In other words, the error detection bit sequence 122 may comprise less bits than a number of check bits of the error correction code. In this way, the error detection probability of the error detector 120 can be adapted to the required error detection probability resulting in reduced hardware requirements for reduced error detection probability requirements. So, the necessary hardware efforts can be easily adapted to applications with different error detection probability requirements.

In other words, the error correction code may be used by the error corrector for correcting a correctable bit error within the faulty subset of bits and the same error correction code may be used by the error detector for detecting an error within the error detector input binary word 118. In this connection, the error correction code may also be called error correction and detection code or error correction/detection code and may be used for error correction or for error detection or for error correction and detection.

For example, codes can be used for error correction and for error detection. For instance a Hamming Code can be used for 1-bit error correction or for 1-bit and 2-bit error detection. Similarly a Hsiao-Code can be used for 1-bit error correction and simultaneously for 2-bit error detection. If a Hsiao Code is used for error detection only, 1-bit, 2-bit and 3-bit errors are detected. Here, the notion "error correction code" is used and it is not excluded that the corresponding code can be also used for error detection.

The error detector input binary word 118 is based on a corrected coded binary word 112 containing the corrected subset of bits and maximally a proper subset of bits of the faulty coded binary word 102. The error detector input binary word 118 may be the corrected coded binary word 112 itself or the corrected coded binary word 112 may be combined with one or more other coded binary words 114 to obtain the error detector input binary word 118 as it will be explained in more detail later on.

The corrected coded binary word 112 contains the corrected subset of bits and maximally a proper subset of bits of the possibly faulty coded binary word. Depending on whether the error corrector 110 may be implemented to correct a correctable bit error within all bits of a faulty coded binary word or only a proper subset of bits of a faulty coded binary word, the corrected coded binary word 112 may contain only the corrected subset of bits (representing all bits of a coded binary word) and no bit of the faulty coded binary word itself (bits, which are not corrected by the error corrector) or the corrected coded binary word 112 may contain the corrected subset of bits representing only a proper subset of bits of a coded binary word and one or more bits (the proper subset of bits) of the faulty coded binary word, which are not corrected by the error corrector 110. In other words, the proper subsets of bits of a faulty coded binary word may be an empty subset or may contain between one bit of the faulty coded binary word and all except one bit of the faulty coded binary word. In still other words, at least one bit of a coded binary word is considered for correction by the error corrector 110, so that maximally all except one bit (the proper subset of bits) of the faulty coded binary word is contained by the corrected coded binary word 112 directly without processing by the error corrector 110.

Figure 2:
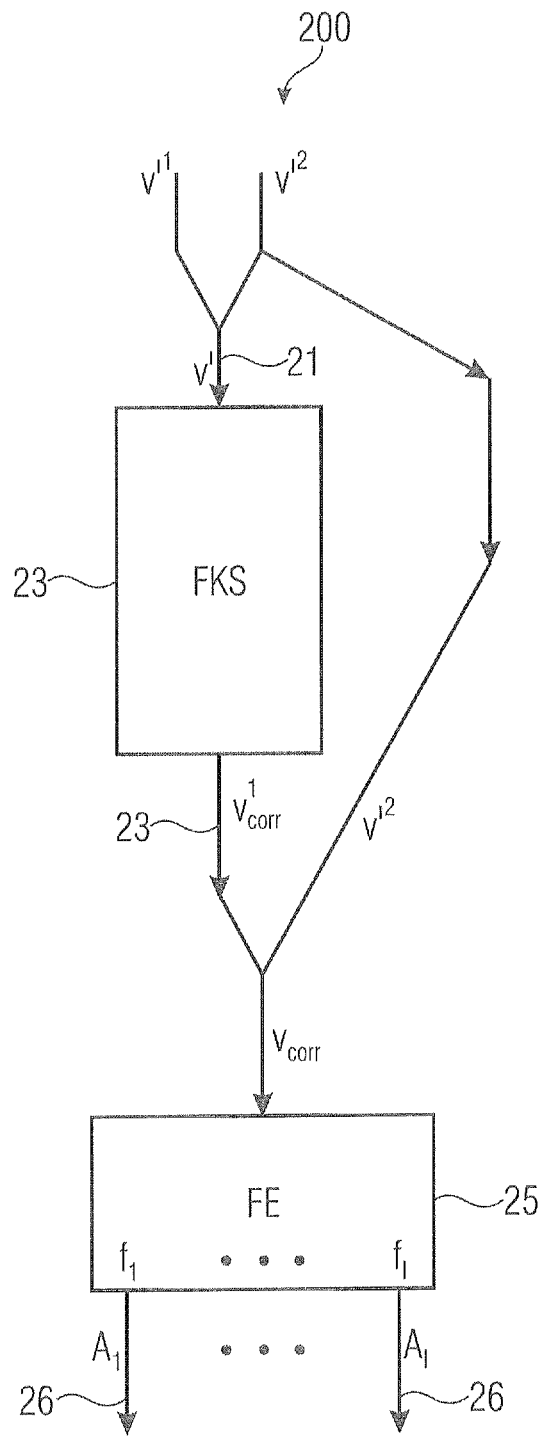
FIG. 2 is a block diagram of an apparatus for detecting an error within a coded binary word.

FIG. 2 shows a block diagram of an apparatus 200 for detecting an error within a coded binary word according to an embodiment of an aspect. The apparatus 200 is similar to the apparatus shown in FIG. 1 and illustrates an example for an error corrector 23 (FKS) implemented for correcting only a part (a proper subset) of bits of a faulty coded binary word v' 21 the input of the error corrector 23 may be a faulty coded binary word v' 21 containing a first group of bits $v'^1$ to be corrected and a second group of bits $v'^2$ to be not corrected. If the bits to be corrected contain a correctable bit error (faulty subset of bits $v'^1$ of the faulty coded binary word v') and the error corrector 23 works faultlessly, the corrected subset of bits $v^1_{corr}$ 24 is equal to a corresponding subset of bits of a code word of the error correction code. If the error corrector 23 does not work faultlessly, the corrected subset of bits $v^1_{corr}$ 24 may comprise at least one faulty bit and therefore is not equal to a corresponding subset of bits of a code word of the error correction code. After correcting the faulty subset $v'^1$, the corrected subset of bits $v^1_{corr}$ 24 and the second group of bits $v'^2$ not considered for correction (representing the proper subset of bits $v'^2$ of the faulty coded binary word v') are provided to the error detector 25. The error detector 25 determines an error detection bit sequence $A_1, \ldots, A_I$ 26 indicating whether or not the error detector input binary word, which is in this example the corrected coded binary word $v_{corr}$ containing the corrected subset of bits $v^1_{corr}$ 24 and the proper subset of bits $v'^2$ of the faulty coded binary word v' 21, is a code word of the error correction code.

In this example, the faulty subset $v'^1$ is a proper subset of bits of the faulty coded binary word v' 21, which means that the error corrector 23 may not correct a correctable bit error of all bits of a coded binary word. Further, the proper subset of bits $v'^2$ of the faulty coded binary word v' contained by the corrected coded binary word $v_{corr}$ is a complementary subset of bits in comparison to the faulty subset of bits $v'^1$. This means that the proper subset of bits $v'^2$ of the faulty coded binary word v' 21 contains the bits of a coded binary word for which a correctable bit error is not corrected by the error corrector 23. In still other words, the corrected subset of bits $v^1_{corr}$ and the proper subset of bits $v'^2$ of the faulty coded binary word v' 21 complete one another to form a code word $v_{corr}$, the error correction code, if the error corrector 23 works faultlessly and the proper subset of bits $v'^2$ of the faulty coded binary word v' 21 comprises no bit error.

In some embodiments, the error detection bit sequence 122, 26 may be determined by the error detector 120, 25, so that the error detection bit sequence 122, 26 comprises the same predefined detection bit sequence for all possible code words of the error correction code. In this way, it can be easily determined from the error detection bit sequence 122, 26 whether or not the error detector input binary word is a code word of the error correction code. For example, this predefined detection bit sequence may comprise only bits equal to 0 or only bits equal to 1, although also other bit sequences may be chosen for the predefined detection bit sequence.

Alternatively, according to an embodiment of an aspect, the error detection bit sequence 122, 26 may be determined by the error detector 120, 25, so that the error detection bit sequence 122, 26 comprises more than one predefined detection bit sequence for different code words of the error correction code. For example, the error detector 120, 25 may determine the error detection bit sequence 122, 26, so that the error detection bit sequence 122, 26 is equal to a first predefined detection bit sequence for a first subset of code words of the error correction code and equal to a second predefined detection bit sequence for a second subset of code words of the error correction code. The first predefined detection bit sequence is different from the second predefined detection bit sequence and the first subset is different from the second subset. In this way, a stuck at fault at least at an output of the error detector 120 can be identified, since at least for two different code words of the error correction code, the error detection bit sequence 122, 26 comprises different predefined detection bit sequences, if the error detector 120, 25 works faultlessly.

For example, if the error detection bit sequence 122, 26 is either equal to the first predefined detection bit sequence or equal to the second predefined detection bit sequence for each code word of an error correction code, then the error detection bit sequence 122, 26 may be unequal to the first predefined detection bit sequence and the second predefined detection bit sequence, if the corrected coded binary word is no code word of the error correction code. In this way, an error caused by the error corrector 110 or an error already contained in the proper subset of bits of the faulty coded binary word can be detected.

Although an arbitrary bit sequence may be chosen for the first predefined detection bit sequence and the second predefined detection bit sequence (since implementing one or more inverters at the outputs of the error detector can realize every predefined bit sequence), all bits of the first predefined detection bit sequence may be 0 and all bits of the second predefined detection bit sequence may be 1. In this way, stuck-at-0 or stuck-at-1 errors at the outputs of the error detector 120, 25 can be detected.

Figure 4:
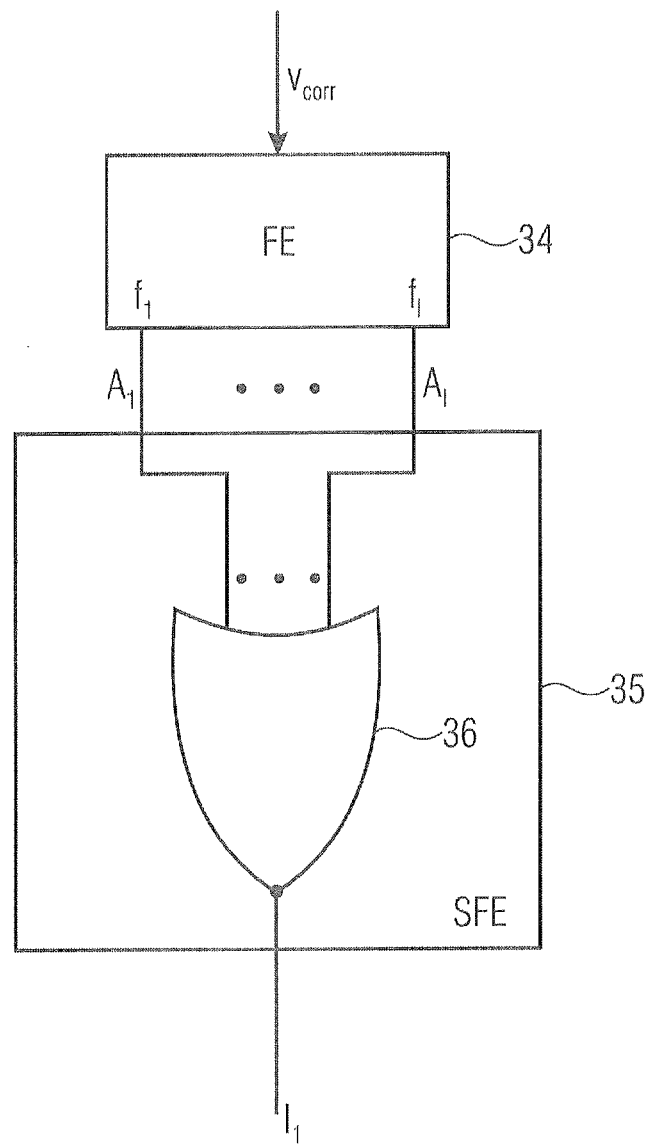
FIG. 4 is a block diagram of an error detector and an error indication determiner.

For example, the error detection bit sequence 122 can be further processed by an error indication determiner. An example for an error indication determiner 35 is shown in FIG. 4. In this example, the error detector 34 determines an error detection bit sequence $A_1 \ldots A_f$ comprising only bits equal to 0, if the error detector input binary word $v_{corr}$ is equal to an arbitrary code word of the error correction code. The error indication determiner 35 comprises an NOR gate 36 with inputs for the error detection bit sequence and one binary output $e_1$ being equal to 1, if the error detection bit sequence comprises only bits equal to 0, and being equal to 0 otherwise. Consequently, an error within the error detector input binary word $v_{corr}$ is detected if the binary output $e_1$ of the error indication determiner 35 is equal to 0, if the error detector 34 and the error indication determiner 35 work faultlessly.

Figure 5:
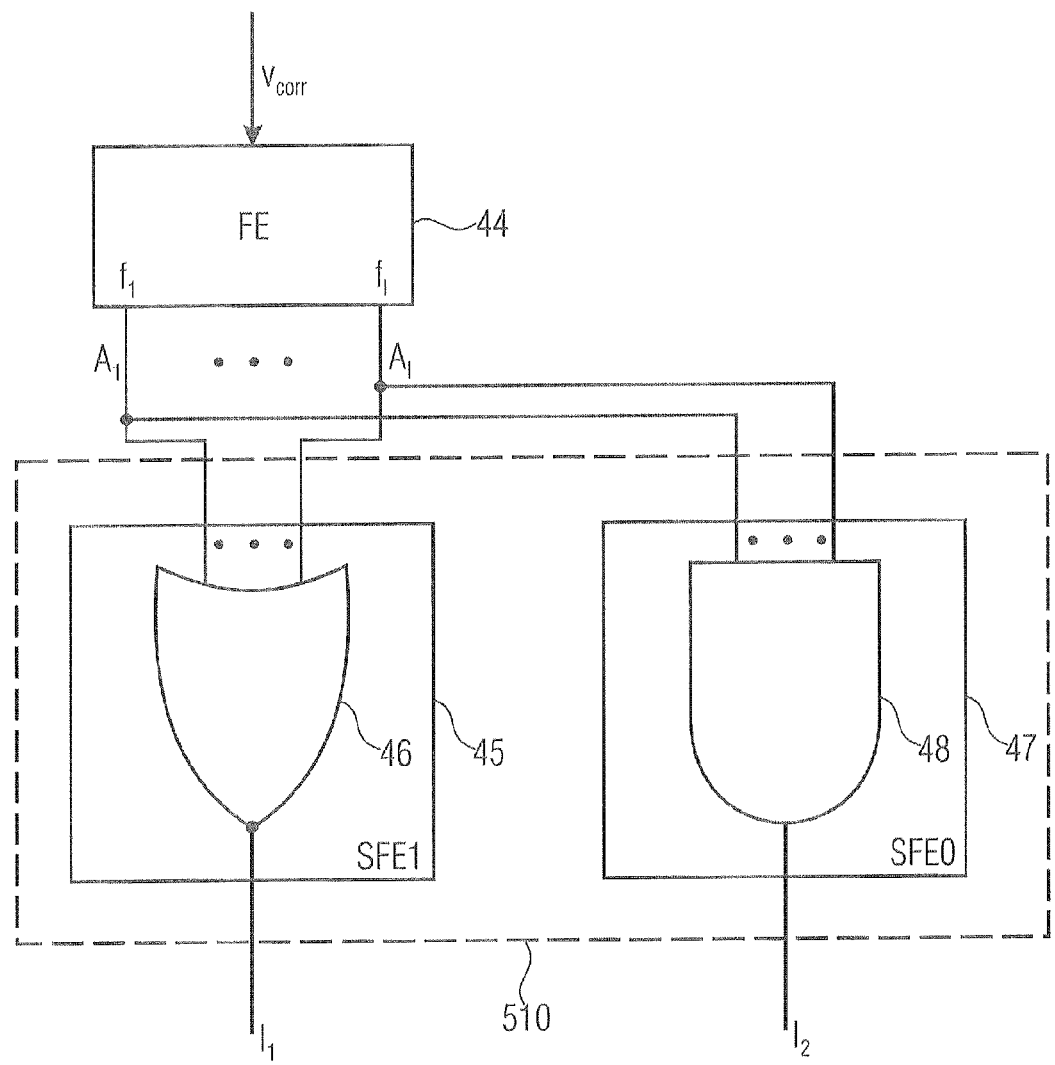
FIG. 5 is a block diagram of an error detector and an error indication determiner.

Alternatively, as mentioned before, the error detection bit sequence $A_1 \ldots A_f$ may be equal to two or more predefined detection bit sequences for different code words of the error correction code. FIG. 5 shows an example for an error indication determiner 510 connected to the output of the error detector 44, if the error detection bit sequence comprises either a first predefined detection bit sequence or a second predefined detection bit sequence (two different predefined detection bit sequences) for each code word of the error correction code. The error indication determiner 510 comprises a first combinatorial circuit 45 with an NOR gate 46 as described above and a second combinatorial circuit 47 with an AND gate 48 combining the bits of the error detection bit sequence according to a logical AND function to obtain a second binary output $e_2$ of the error indication determiner 510. The binary output $e_1$ of the NOR gate 46 and the binary output $e_2$ of the AND gate 48 may be together called error indication bit sequence. If the error indication bit sequence is 01 or 10, the error detection bit sequence comprises only bits equal to 0 or only bits equal to 1, which may be the first predefined detection bit sequence and the second predefined detection bit sequence indicating that the error detector input binary word $v_{corr}$ is a code word of the error correction code. Consequently, if the error indication bit sequence is 00 or 11 (the binary output of the NOR gate is equal to the binary output of the AND gate), the error detector input binary word $v_{corr}$ is no code word of the error correction code and an error within the coded binary word is detected.

In other words, the apparatus shown in FIG. 1 and/or FIG. 2 may comprise additionally an error indication determiner, which determines based on the error detection bit sequence an error indication bit sequence indicating whether or not an error within the error detector input binary word is detected. The error indication bit sequence may comprise one bit, if only one possible value of the error detection bit sequence is obtainable for all code words of the error correction code, or the error indication bit sequence may comprise two bits, if at least two different possible values of the error detection bit sequence are obtainable for different code words of the error correction code.

For example, the error correction code may be a linear error correction code, although also a non-linear error correction code may be used. For example, the error correction code may be a Hamming Code, a Hsiao Code or a BCH code.

In some embodiments, the error detector 120, 25, 34, 44 may determine the error detection bit sequence based on a multiplication of an error detection matrix and the error detector input binary word. The error detection matrix may be based on a check matrix (e.g. a parity check matrix) of the error correction code.

For example, the error detection matrix comprises less rows than the check matrix or less columns than the check matrix. In other words, the error detection bit sequence may comprise less bits than a number of check bits of the error correction code as already described above.

Further, for example, the error detection matrix comprises at least one column or at least one row derivable by inverting at least one element of a corresponding column or at least one element of a corresponding row of the check matrix or by inverting at least one element of a corresponding column or at least one element of a corresponding row of a matrix resulting from a multiplication of a transformation matrix and the check matrix.

In some embodiments, the input of the error corrector 110, 23 may be a coded binary word provided by an addressable storage (e.g. ROM, RAM or non volatile memory), a coder or may be received from a transmitter. In any case, the coded binary word may comprise one or more faulty bits resulting in a faulty coded binary word.

For example, a coded binary word or a faulty coded binary word comprises a first group of bits representing data bits, a second group of bits representing check bits of the error correction code and a third group of bits representing address bits.

Further, the faulty subset of bits of the faulty coded binary word may contain only the first group of bits and the second group of bits and the corrected coded binary word contains the corrected subset of bits and the third group of bits of the faulty coded binary word (representing the proper subset of bits of the faulty coded binary word). In other words, the first group of bits and the second group of bits may be corrected by the error corrector, if a correctable bit error within these bits occur and the error corrector works faultlessly, while the third group of bits are not corrected by the error corrector, if the correctable bit error occurs within the third group of bits.

Figure 3:
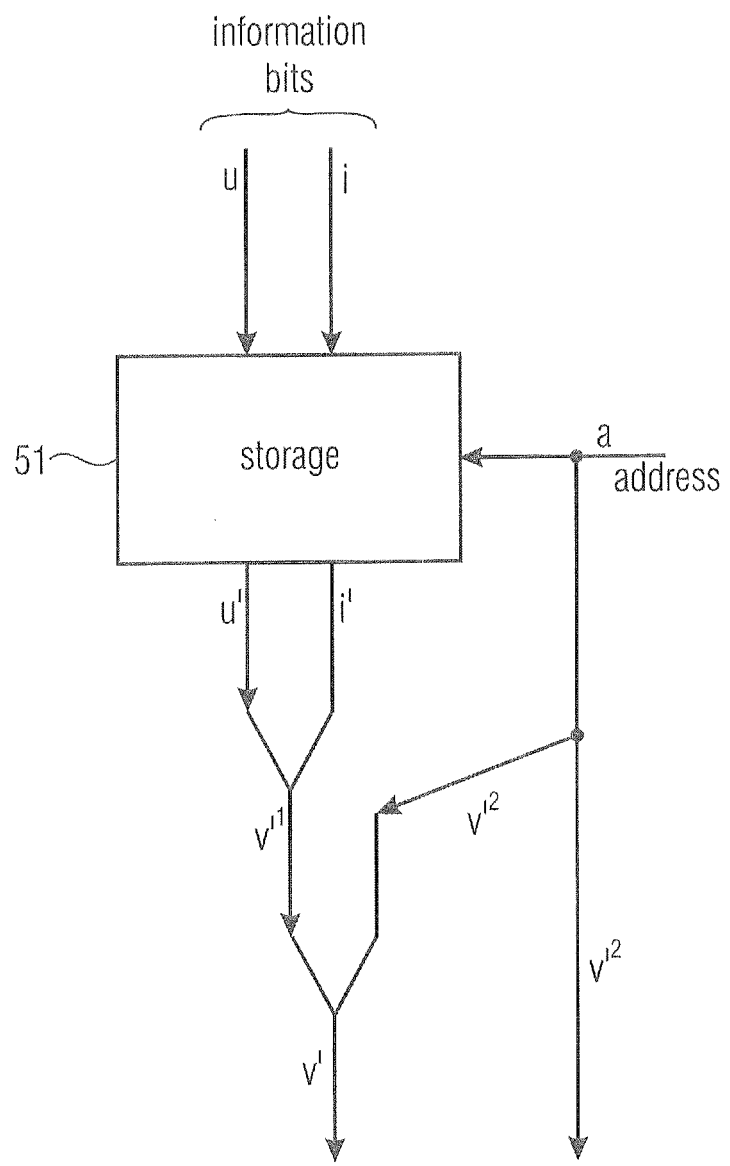
FIG. 3 is a block diagram of an addressable storage for storing and providing binary words.

A coded binary word, which may be a faulty coded binary word, may be provided to the error corrector by an addressable storage 51 as shown in FIG. 3. In this example, the first group of bits u, u' (data bits) and the second group of bits c, c' (check bits) are stored at an address of the addressable storage 51 indicated by the third group of bits a (address bits).

As already mentioned before, the error detector input binary word may be a combination of the corrected coded binary word and at least one other coded binary word. For this, in some embodiments, the apparatus for detecting an error within a coded binary word may comprise additionally a combiner, which determines the error detector input binary word by combining the corrected coded binary word and a second coded binary word, so that the error detector input binary word is a code word of the error correction code, if the corrected coded binary word and the second coded binary word are code words of the error correction code, and so that the error detector input binary word is no code word of the error correction code, if the corrected coded binary word or the second coded binary word is no code word of the error correction code. In this way, an error within several input coded binary words can be detected simultaneously by the same error detector.

It was described that the error detector detects errors in its input sequences which are coded by a code C. In most of the examples described so far the same code C was also used for error correction of faulty bits in a subset of bits of a code word by the corrector circuit.

Alternatively the described error detector can be also applied for the detection of erroneous bits in its input sequences coded by a code C independently whether the code C was used for error correction to determine the input sequences of the detector or whether the code C is used for error correction or for error detection only.

Figure 7:
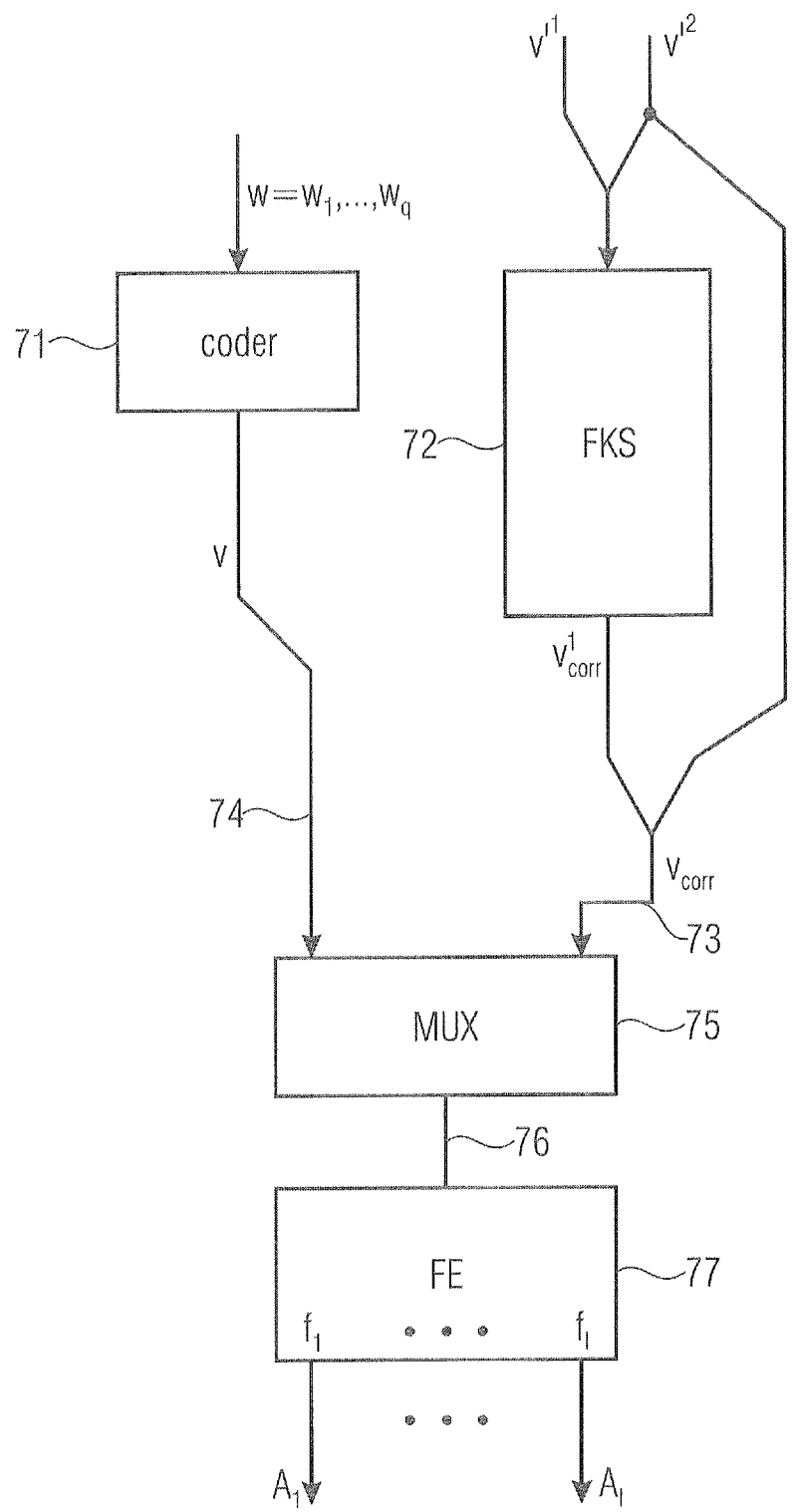
FIG. 7 is a block diagram of an apparatus for detecting an error within a coded binary word.

For example in FIG. 7 the output v of the coder 71 is a code word of the considered code C and v is determined from the information bits w by the coder 71. The output of the coder 71 is connected by the lines 74 via the multiplexer MUX 75 by the lines 76 without correction directly to the inputs of the detector FE 77. The detector 77 detects whether the output v of the coder 71 is a codeword of the considered code C. By the detector 77 the correctness of the coder 71 may be checked. And in this case the code C was not used for correction of a faulty bit sequence. For example the code C may be a Hamming code and this code can be used either for 1-bit error correction or for 1-bit and 2-bit error detection. In this case the code C is used for detection.

Figure 6:
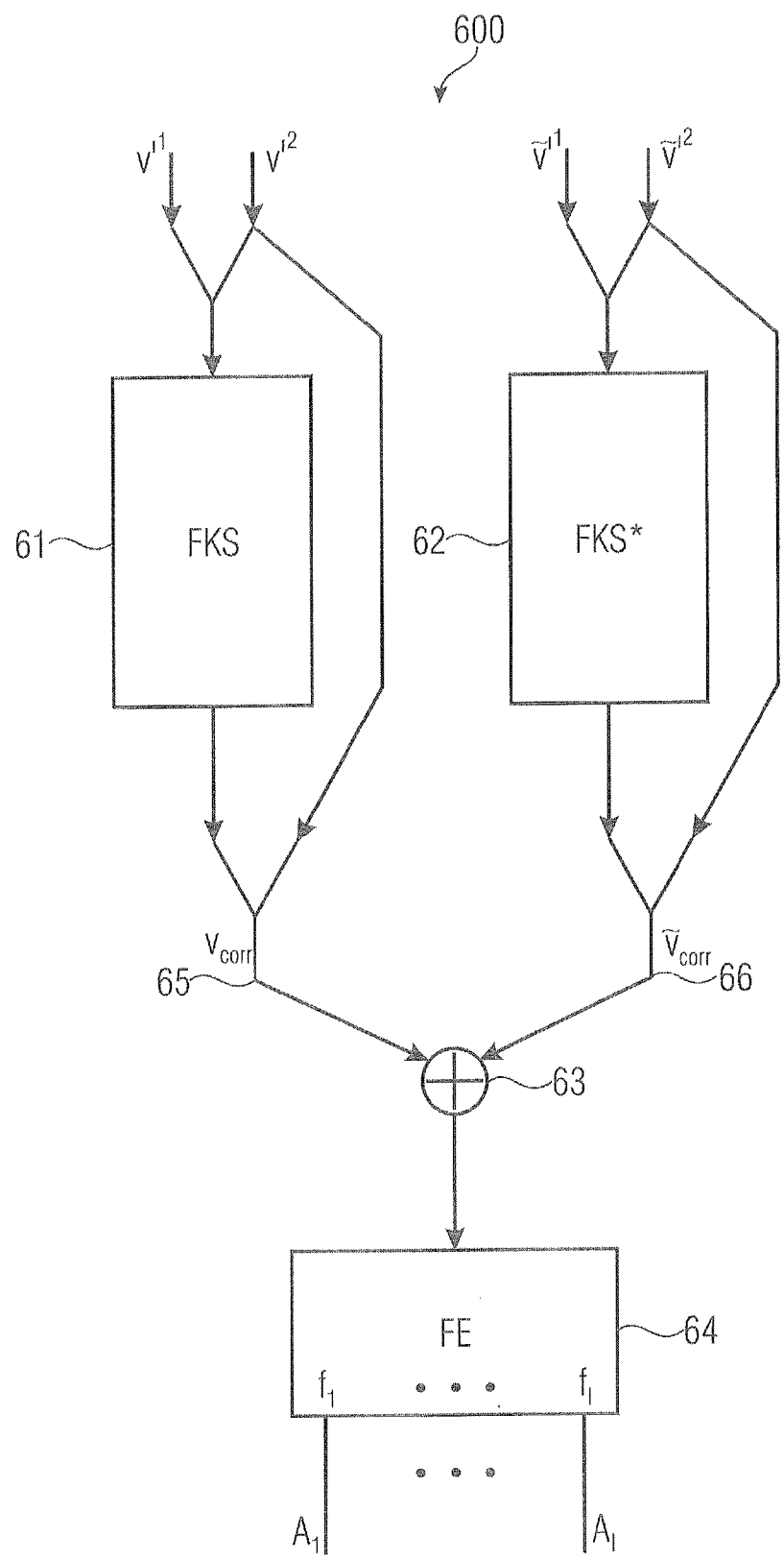
FIG. 6 is a block diagram of an apparatus for detecting an error within a coded binary word.

FIG. 6 shows a block diagram of an apparatus 600 for detecting an error within a coded binary word illustrating the detection of an error within the output of two error correctors 61, 62 by the same error detector 64. The first error corrector 61, the second error corrector 62 and the error detector 64 may be implemented according to one or more aspects described above. In other words, the second error corrector 62 may correct a correctable bit error within a second faulty subset of bits of a second faulty coded binary word coded by the error correction code, so that a corrected second subset of bits 66 is equal to a corresponding subset of bits of the code word of the error correction code, if the second error corrector 62 works faultlessly. The second coded binary word 66 may contain the corrected second subset of bits and maximally a proper subset of bits of the second faulty coded binary word.

In this example, the combiner mentioned before is realized as an XOR gate 63. In other words, the combiner may combine the corrected coded binary word 65 and the second coded binary word 66 by a bitwise logical XOR function (exclusive OR function) to obtain the error detector input binary word.

Alternatively to the second error detector 62, the second coded binary word 62 may be provided by a coder, which encodes a binary word according to the error correction code to obtain the second coded binary word 66.

Further, more than two coded binary words may be combined by the combiner according to the described concept, so that the same error detector may detect an error within the plurality of coded binary words provided by error correctors, coders or transmitters simultaneously.

Therefore, the hardware efforts for the error detection of errors caused by error correctors, coders and/or coded binary words transmitted by a transmitter can be significantly reduced, since the output of several of these units can be processed by the same error detector.

Some embodiments relate to an error detector determining an error detection bit sequence indicating whether or not an error detector input binary word is a code word of an error correction code. The error detector may determine the error detection bit sequence based on a multiplication of an error detection matrix and the error detector input binary word. The error detection matrix is based on a check matrix of the error correction code. Further, the error detection matrix comprises less rows than the check matrix or less columns than the check matrix.

In this way, the error detection probability of the error detector can be adapted to the required error detection probability resulting in reduced hardware requirements for reduced error detection probability requirements. So, the necessary hardware efforts can be easily adapted to applications with different error detection probability requirements.

Further embodiments relate to an error detector determining an error detection bit sequence indicating whether or not an error detector input binary word is a code word of an error correction code. The error detector determines the error detection bit sequence based on a multiplication of an error detection matrix and the error detection input binary word. Further, the error detection matrix is based on the check matrix of the error correction code and the error detection matrix comprises at least one column or at least one row derivable by inverting at least one element of a corresponding column or at least one element of a corresponding row of the check matrix.

In this way a suitable error detection matrix may be found easily.

For example, an error detector may be configured to determine an error detection bit sequence indicating whether or not an error detector binary word is a code word of a linear code C of length n with q information bits, with m=n−q and with an (m,n) check matrix H. Further, the error detector is configured to determine the error detection bit sequence based on a multiplication of an error detection (I,n)-matrix L and the error detector input binary word. The error detection matrix L is determined based on an (I,n)-Matrix M which is defined as the product of a transformation matrix K and the matrix H as M=K H, where K is an (I,m) binary matrix for which not all elements are equal to 0 and l is lower or equal to m. The error detection matrix L may comprise at least one column or at least one row derivable by inverting at least one element of a corresponding column or at least one element of a corresponding row of the (I,n)-matrix M.

In other words, the (I,n)-error detection matrix L may be determined based on a matrix M which is the product M=K H of a binary (I,m)-transformation matrix K and the (m,n)-check matrix H of the error correction code where K (transformation matrix) is an (I,m)-binary matrix for which not all elements are equal to 0 and where the error detection matrix L comprises at least one column or at least one row derivable by inverting at least an element of a corresponding column or at least an element of a corresponding row of the check matrix.

In still other words, the error detection matrix may be determined based on a first matrix which is determined by multiplying the check matrix of the code by an binary matrix for which not all elements are equal to zero and where the error detection matrix comprises at least one row or at least one column derivable by inverting at least an element of a corresponding row of the first matrix or at least an element of a corresponding column of the first matrix.

For deriving the L matrix from the H matrix, for example, the first and the second row of H are added modulo 2 (e.g. by a multiplication with a suitable matrix K). The determined matrix is the M matrix. For determining L, for example, all elements of the first column of the M matrix are inverted.

Further embodiments relate to an apparatus for detecting an error within a coded binary word comprising a means for correcting a bit error and a means for determining an error detection bit sequence. The means for correcting a bit error corrects a correctable bit error within a faulty subset of bits of a faulty coded binary word coded by an error correction code, so that the corrected subset of bits is equal to a corresponding set of bits of a code word of the error correction code, if the means for correcting a bit error works faultlessly. Further, a means for determining an error detection bit sequence determines an error detection bit sequence indicating whether or not an error detector input binary word is a code word of the error correction code. The error detector input binary word is based on a corrected coded binary word containing the corrected subset of bits and maximally a proper subset of bits of the faulty coded binary word.

Figure 8:
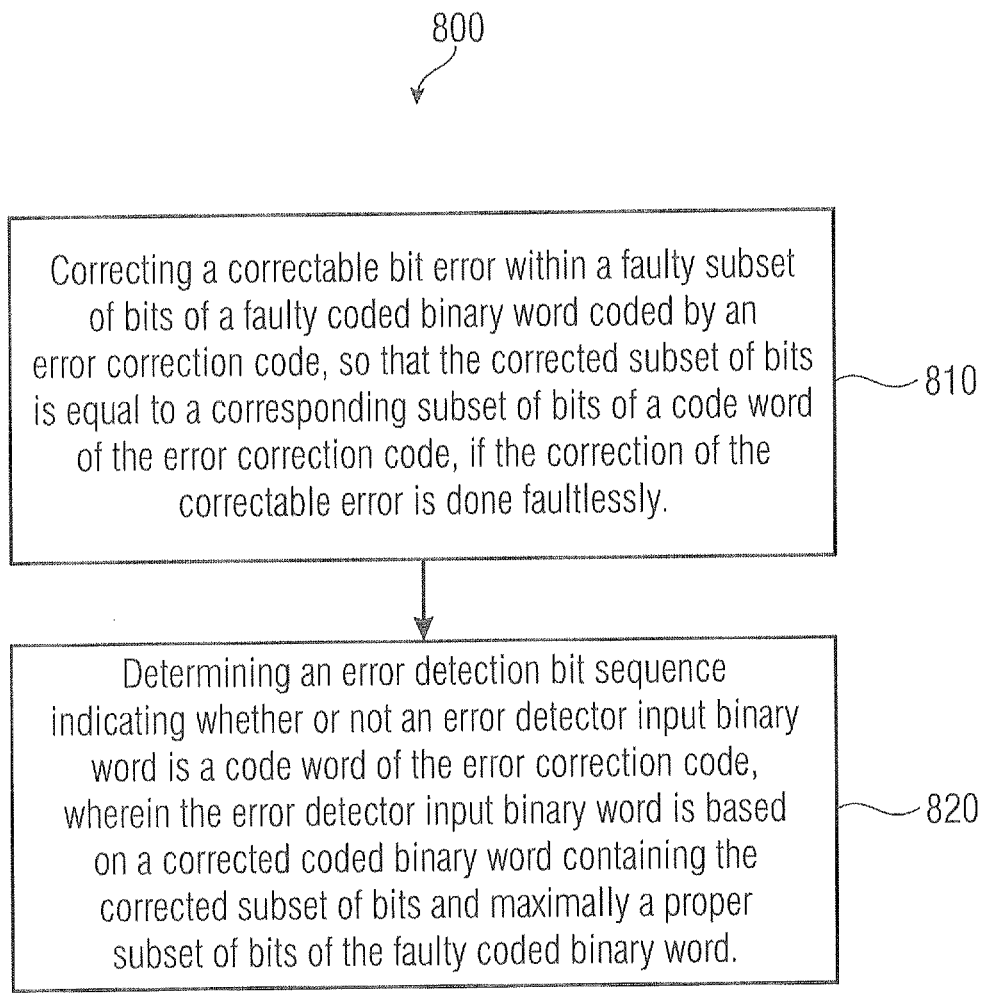
FIG. 8 is a flowchart of a method for detecting an error within a coded binary word.

FIG. 8 shows a flowchart of a method 800 for detecting an error within a coded binary word according to an embodiment of an aspect. The method 800 comprises correcting 810 a correctable bit error within a faulty subset of bits of a faulty coded binary word coded by an error correction code, so that the corrected subset of bits is equal to a corresponding subset of bits of a code word of the error correction code, if the correction of the correctable error is done faultlessly. Further, the method 800 comprises determining 820 an error detection bit sequence indicating whether or not an error detector input binary word is a code word of the error correction code. The error detector input binary word is based on a corrected coded binary word containing the corrected subset of bits and maximally a proper subset of bits of the faulty coded binary word.

Additionally, the method 800 may comprise further steps representing one or more of the optional aspects of the proposed concept described above.

Figure 9:
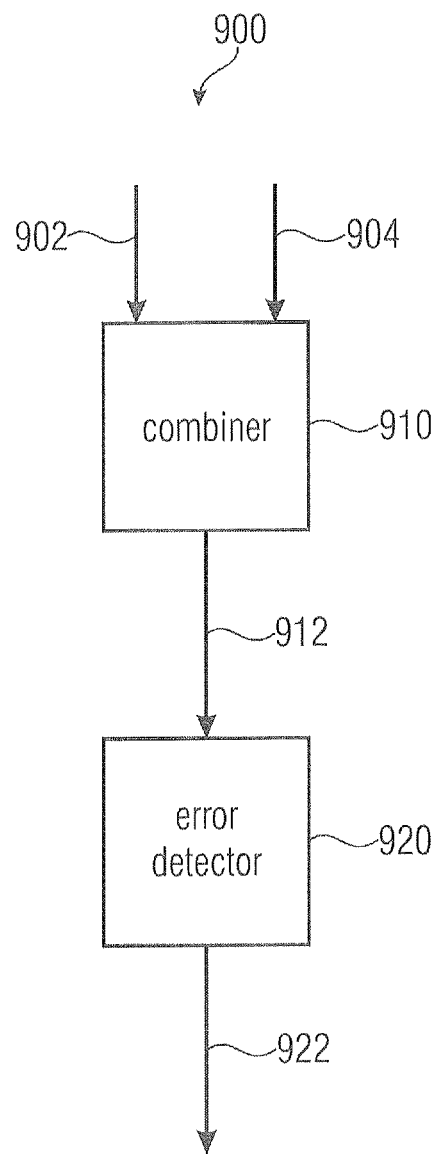
FIG. 9 is a block diagram of an apparatus for detecting an error within a plurality of coded binary words coded by an error correction code.

FIG. 9 shows a block diagram of an apparatus 900 for detecting an error within a plurality of coded binary words coded by an error correction code according to an embodiment of an aspect. The apparatus 900 comprises a combiner 910 connected to an error detector 920. The combiner 910 determines a combined binary word 912 by combining a first coded binary word 902 and a second coded binary word 904 of the plurality of coded binary words, so that the determined combined binary word 912 is a code word of the error correction code, if the first coded binary word 902 and the second coded binary word 904 are code words of the error correction code, and so that the determined combined binary word 912 is no code word of the error correction code, if the first coded binary word 902 or the second coded binary word 904 is no code word of the error correction code. Further, the error detector 920 may determine an error detection bit sequence 922 indicating whether or not the determined combined binary word 912 is a code word of the error correction code.

By combining two or more coded binary words to one combined binary word, so that the determined combined binary word is a code word of the error correction code, if all coded binary words to be combined are code words of the error correction code, the error detector 920 can detect an error within one or more of the coded binary words simultaneously. Therefore, only one error detector may be necessary for detecting errors within a plurality of coded binary words resulting in a significantly reduced hardware effort for the error detection.

The plurality of coded binary words comprises at least the first coded binary word and the second coded binary word, which may be provided from two independent sources (e.g. error corrector, coder or transmitter). However, the plurality of coded binary words may comprise also more than two coded binary words provided by more than two different independent sources. In this example, the combiner may determine the combined binary word 912 by combining all coded binary words of the plurality of coded binary words, so that the determined combined binary word 912 is a code word of the error correction code, if all coded binary words of the plurality of coded binary words are code words of the error correction code, and so that the determined combined binary word 912 is no code word of the error correction code, if a coded binary word of the plurality of coded binary words is no code word of the error correction code.

The plurality of coded binary words may be provided by one or more error correctors, coders or may be received from one or more transmitters, for example.

For example, the first coded binary word may be provided by a first error corrector and the second coded binary word may be provided by a second error corrector or a first coded binary word may be provided by an error corrector and a second coded binary word may be provided by a coder.

For example, the combiner may comprise an XOR gate for determining the combined binary word, if the error correction code is a linear error correction code. In other words, the combiner 910 may combine the first coded binary word 902 and the second coded binary word 904 by a bitwise logical XOR function to obtain the combined binary word 912.

Alternatively, the error correction code may be a non-linear error correction code and the combiner 910 may realize a combination of the first coded binary word 902 and the second coded binary word 904 based on the non-linear error correction code, so that the combined binary word 912 is a code word of the non-linear error correction code, if the first coded binary word 902 and the second coded binary word 904 are code words of the non-linear error correction code.

The error detector 920 may be implemented in various ways, for example, the error detector 920 may be implemented according to one or more aspects or possible variations of an error detector 120, 25, 34, 44, 64 described before. In this connection, the combined binary word 912 corresponds to the error detector input binary word.

Additionally, the apparatus 900 may comprise an error corrector. This error corrector may correct a correctable bit error within a faulty subset of bits of a faulty coded binary word coded by the error correction code, so that a corrected subset of bits is equal to a corresponding subsets of bits of a code word of the error correction code, if the error corrector works faultlessly. In this example, the first coded binary word 902 contains the corrected subset of bits and maximally a proper subset of bits of the faulty coded binary word.

The error corrector may be implemented in various ways. For example, the error corrector may be implemented according to one or more aspects of an error corrector 110, 23, 61, 62 described before. In this connection, the first coded binary word 902 corresponds to the corrected coded binary word mentioned before.

Similar as mentioned before, the faulty subset may be a proper subset of the bits of the faulty coded binary word and the proper subset of the bits of the faulty coded binary word contained by the first coded binary word may be a complementary subset of bits in comparison to the faulty subset of bits.

Alternatively, the faulty subset of bits is equal to the faulty coded binary word and the first coded binary word contains only the corrected subset of bits representing a corrected faulty coded binary word.

Further, the apparatus 900 may comprise a second error corrector. This second error corrector may correct a correctable bit error within a second faulty subset of bits of a second faulty coded binary word coded by the error correction code, so that the corrected second subset of bits is equal to a corresponding subset of bits of a code word of an error correction code, if the second error corrector works faultlessly. In this example, the second coded binary word 904 contains the corrected second subset of bits on maximally a proper subset of bits of the second faulty coder primary word.

Similarly, the first error corrector, the second error corrector may be implemented according to one or more aspects of an error detector mentioned above.

An example for an apparatus for detecting an error within a plurality of coded binary words coded by an error correction code comprising two error correctors and a combiner realized by an XOR gate was already shown and described in FIG. 6.

Alternatively to the second error corrector, the apparatus 900 may comprise a coder, which encodes a binary word according to the error correction code to obtain the second coded binary word.

Additionally, the apparatus 900 may comprise one or more further error correctors and/or coders providing a coded binary word of the plurality of coded binary words.

Similar as already mentioned in connection with other aspects, the error detection bit sequence 922 may comprise less bits than a number of check bits of the error correction code, so that the error detection probability and the hardware efforts for the error detector may be adapted to the requirements of the application.

Additionally, or alternatively, the error detector 920 may determine the error detection bit sequence 922, so that the error detection bit sequence 922 is equal to a first predefined detection bit sequence for a first subset of code words of the error correction code and equal to a second predefined detection bit sequence for a second subset of code words of the error correction code. The first predefined detection bit sequence is different from the second predefined detection bit sequence and the first subset is different from the second subset.

Further, the error detection bit sequence 922 may be unequal to the first predefined detection bit sequence and the second predefined detection bit sequence, if the corrected coded binary word is no code word of the error correction code.

For example, the bits of the first predefined detection bit sequence are all 0 and the bits of the second predefined detection bit sequence are all 1.

In this way, for example, also stuck-at faults at least at the outputs of the error detector 920 can be detected as already described above.

As already mentioned, for example, the error detector 920 may determine the error detection bit sequence 922 based on a multiplication of an error detection matrix and the determined combined binary word 912. This error detection matrix is based on a check matrix of the error correction code.

The error detection matrix may comprise less rows than the check matrix or less columns than the check matrix, for example.

Alternatively, or additionally, the error detection matrix may comprise at least one column or at least one row derivable by inverting a corresponding column or a corresponding row of the check matrix.

As already mentioned before, a coded binary word, which may be a faulty coded binary word, may be provided by an addressable storage, a coder or a transmitter, for example. This is similar as already described in connection with FIG. 3.

Some embodiments according to an aspect relate to an apparatus for detecting an error within a plurality of coded binary words coded by an error correction code. The apparatus comprises a means for determining a combined binary word and a means for determining an error detection bit sequence. The means for determining a combined binary word determines a combined binary word by combining a first coded binary word and a second coded binary word of the plurality of coded binary words, so that the determined combined binary word is a code word of the error correction code, if the first coded binary word and the second coded binary word are code words of the error correction code, and so that the determined combined binary word is no code word of the error correction code, if the first coded binary word or the second coded binary word is no code word of the error correction code. Further, the means for determining an error detection bit sequence determines an error detection bit sequence indicating whether or not the determined combined binary word is a code word of the error correction code.

Figure 10:
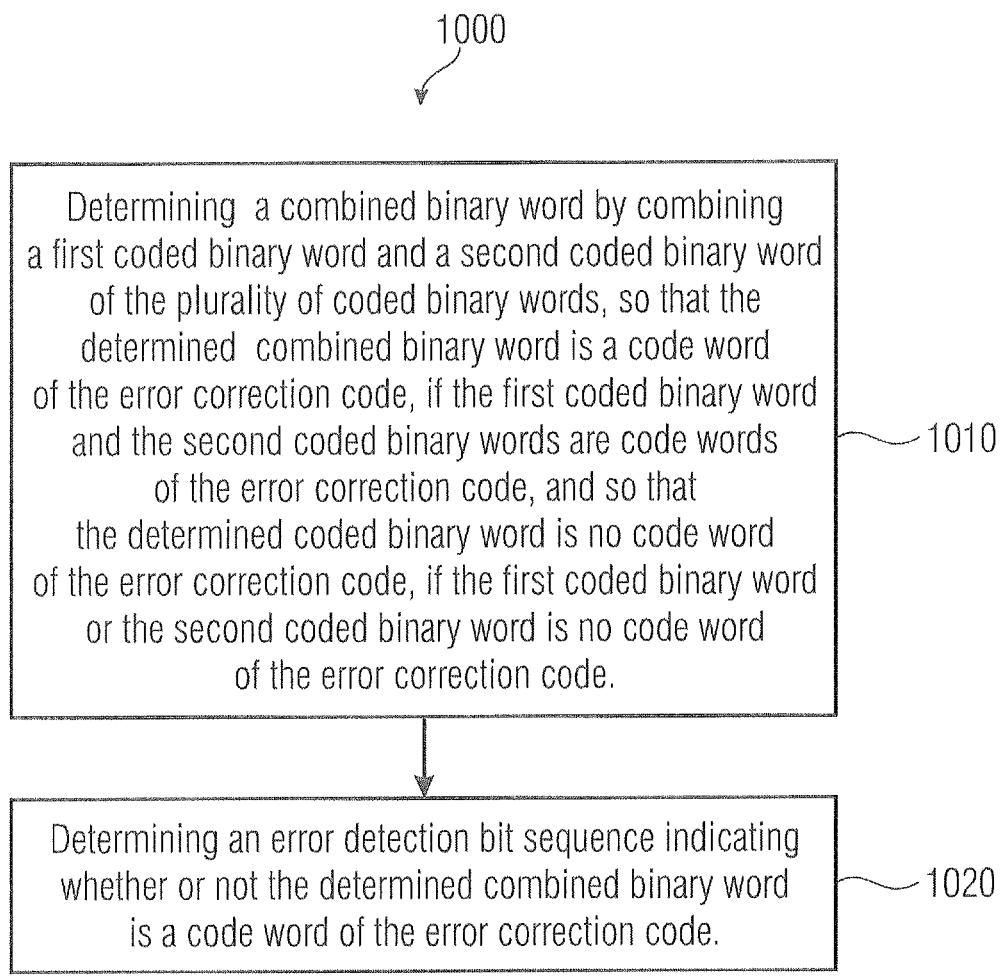
FIG. 10 is the flowchart of a method for detecting an error within a plurality of coded binary words coded by an error correction code.

FIG. 10 shows a flowchart of a method 1000 for detecting an error within a plurality of coded binary words coded by an error correction code according to an embodiment of an aspect. The method 1000 comprises determining 1010 a combined binary word by combining a first coded binary word and a second coded binary word of the plurality of coded binary words, so that the determined combined binary word is a code word of the error correction code, if the first coded binary word and the second coded binary words are code words of the error correction code, and so that the determined combined binary word is no code word of the error correction code, if the first coded binary word or the second coded binary word is no code word of the error correction code. Further, the method 1000 comprises determining 1020 an error detection bit sequence indicating whether or not the determined combined binary word is a code word of the error correction code.

Additionally, the method 1000 may comprise further steps representing one or more of the optional aspects of the proposed concept described above.

In the following, aspects are described in more detail based on FIGS. 2-7. Although these examples show different aspects implemented together, these aspects may also be implemented independent from each other.

First, one embodiment is to be explained with reference to FIG. 2. FIG. 2 shows an circuitry for error detection of errors in an error correction circuit FKS 23 (error corrector) correcting errors in the input data using, for example, a linear code C.

The length of the code C is designated by n, and the number of information bits $w=w_1, \ldots w_q$ is designated by q, wherein $q<n$. Examples for error correction codes are Hamming-Codes, for example described in "Lin, S., Costello, D., "Error Control coding", Prentice Hall, 1983, pp. 79-82, Hsiao-Codes for example described in Fujijwara, E., "Code Design for Dependable Systems", Wiley, 2006, pp. 98-101", Hsiao codes, as described for example in "Fujijwara, E., "Code Design for Dependable Systems", Wiley, 2006 S. 98-101", BCH-Codes for example described in "Micheloni, R., Marelli, A. und Ravasio, R., "Error Correction Codes for Non.Volatile Memories", Springer 2008, S. 48-54" and Reed-Muller codes allowing a majority decoding as it is for example described in "Micheloni, R., Marelli, A. und Ravasio, R. "Error Correction Codes for Non-Volatile Memories" Springer 2008, S. 38-42".

In applications, codes are frequently used by a person skilled in the art in an shortened form to adapt the same to the actually required word width. This may be done by deleting columns of the H-matrix of the unshortened code.

For a linear code C, the associated code word v is determined from the information bits w by $$v = w \cdot G$$

wherein G is a generator matrix of the code C and G is a (q, n)-matrix.

Based on to the relation $$s^T = H \cdot v'^T$$

it may be checked whether the word $v'=(v'_1, \ldots, v'_n)$ is a code word of the code C. Here, $v'^T$ designates the transposed column vector of the row vector v'. H is an (m,n)-matrix, the H-matrix (check matrix or parity check matrix) of the code and $s=(s_1, \ldots, s_m)^T$ with $m=n-q$ is the syndrome of the word v'. Here, $(s_1, \ldots, s_m)^T$ designates the transposed column vector of the row vector $(s_1, \ldots, s_m)$. If v'=v is a code word of the code C, the error syndrome is s=0.

The apparatus shown in FIG. 2 is set up of an error correction circuit FKS 23 (error corrector) and an error detection circuit FE 25 (error detector). Into the error correction circuit 23, at its n bit wide input 21, an n bit wide word $v'=v'_1, \ldots, v'_n = v'^I, v'^{I2}$ ($v'^I$ corrected subset of bits, $v'^{I2}$ proper subset of bits of the faulty coded binary word) is input, wherein $v'^I = v'_1, \ldots, v'_p$ and $v'^{I2} = v'_{p+1}, \ldots, v'_n$ with $p \leq n$ applies. If p=n, then $v'^I$ consists of all n components of v' and $v'^{I2}$ comprises no component.

The components of $v'^I$ are the p components of v' which are corrected by the circuit FKS 23, and the components of $v'^{I2}$ are the n-p components of v', which are not corrected by the circuit FKS 23 and which are led on the n-p bit wide line 22 to its output. Without a limitation regarding generality, the components which are corrected were arranged flush left, so that the description becomes more simple. The bits which are corrected may be the data bits $u_1, \ldots, u_k$ and the check bits $c_1, \ldots, u_k$ of a linear code whose information bits w= $w_1, \ldots, w_q$ consists of the data bits $u=u_1, \ldots, u_k$ and the address bits $a=a_1, \ldots, a_r$, wherein the data bits u and the check bits c are stored under the address a in a storage as will be explained in more detail below. It is also possible that p=n and all bits are corrected by the circuit FKS 23.

At its p bit wide output 24, the circuit FKS outputs the values $v_{corr}^1 = v_{corr,1}, \ldots, v_{corr,p}$, provided together with the non-corrected bits $v'^{I2} = v'_{p+1}, \ldots, v'_n$ on the line 22 forming the n-digit binary word $v_{corr} = v_{corr}^1, v'^{I2} = v_{corr,1}, \ldots, v_{corr,n}$.

The error correction circuit FKS 23 corrects words, caused by errors in the first p bits of code words of the code C and which are correctable by the code C.

First the case is considered that the circuit FKS 23 is faultless (works faultlessly). If v'=v applies, wherein v is a code word of the code C, then the following applies $v_{corr} = v$. If C, for example, is a 1-bit correcting Hamming code, then all code words of the Hamming code and all words resulting by the 1 bit error in the first p bits of code words are corrected by the circuit FKS 23 in code words. Words, resulting by 1 bit errors in the bits $v'^{I2}$ of code words are not corrected into code words. If code words of the code C and non-code words of the code C, which originate from code words of the code C by 1-bit errors exclusively within the first p bits, are provided to the input of the circuit FKS 23, then a codeword of the code C is outputted by the circuit FKS 23.

If C is a 2 bit error correcting BCH code, all code words of this code and all words resulting from 1-bit and 2-bit errors of code words exclusively in the first p bits are corrected into code words by the circuit FKS 23. All words resulting from errors in the bits $v'^{I2}$ of code words are not corrected by the circuit FKS 23.

If C is a Reed-Muller Code, for example, of a code distance 8, whose correction circuit may, for example, be implemented as a majority decoding and which may correct all 3-bit errors, then all code words and all words resulting from code words by 1-bit, 2-bit and 3-bit errors exclusively in the first p bits, are corrected by the circuit FKS 23, but not words which resulted from errors in the bits $v'^{I2}$.

The error correction circuit FKS 23 may be a conventional error correction circuit of the error correction code C. If for p<n n-p bits are not corrected, then the non-corrected outputs of a error correction circuit for a code C are, for example, simply ignored and not implemented as hardware.

It is of interest that the error correction circuit FKS 23 transforms not only code words of the code C, but also words which may be generated from code words of the code C by at most t errors in the first p bits and which are applied to the input of this circuit FKS 23, into code words $v_{corr}$ of the code C, if the code C allows to correct t bit errors.

If the circuit FKS 23 is faulty, or contains errors, this may be seen in that $v_{corr}$ is no code word of the code C. If a code word of the code or a non-code word of the code C, which would be corrected to a code word of the code C by a faultless circuit FKS 23, is inputted to a faulty error correction circuit FKS 23, then this can be detected, if $v_{corr}$ is no code word.

This is advantageously detected by an error detection circuit FE 25, which serves, as indicated above, for error detection of errors in the error correction circuit FKS 25.

In this example, the error detection circuit FE 25 is a combinatorial circuit with n inputs and I outputs $A_1, \ldots, A_I$, wherein I≤m which outputs at its outputs an I-component binary error signal $f=f_1, \ldots, f_I$, so that when inputting a code word $v_{corr}$ for the error signal $f_1^{i1} = f_2^{i2} = \ldots = f_I^{iI} = 0$ or $f_1^{i1} = f_2^{i2} = \ldots = f_I^{iI} = 1$ applies and in case that not all components $f_1^{i1} \ldots = f_I^{iI}$ are equal, it is detected that no code word was input into the circuit FE 25. This either caused by an error in the error correction circuit FKS 23 or indicates that a non-correctable word v exists at the input of the error correction circuit and the correction by the circuit FKS was not successful. In this connection, $f_j^{ij} = \bar{f}_j$, if $i_j = 0$ applies, and $f_j^{ij} = f_j$, if $i_j = 1$ applies, and wherein j takes the values $1, \ldots, I$.

If, for example, all values $i_1, \ldots, i_I$ equal to 1, then $f_1^{i1} = f_1, \ldots, f_I^{iI} = f_I$ and at input of a code word applies either $f_1 = f_2 = \ldots = f_I = 1$ or $f_1 = f_2 = \ldots = f_I = 0$ and an error is detected, if not all components $f_1, \ldots, f_I$ are equal. For example, if $j_1 = 1, j_2 = 0, j_3 = 0, j_4 = 1, \ldots, j_I = 1$, then $f_1^{i1} = f_1, f_2^{i2} = \bar{f}_2, f_3^{i3} = \bar{f}_3, f_4^{i2} = f_4, \ldots, f_I^{iI} = f_I$ and at input of a code word $f_1 = \bar{f}_2 = \bar{f}_3 = f_4 = \ldots = f_I$ applies, and an error is indicated, if not all components $f_1, \bar{f}_2, \bar{f}_3, f_4, \ldots, f_I$ are equal.

It is advantageous here that by the selection of the number I of the outputs of the circuit FE 25 the complexity for error detection, for example, in contrast to duplication and comparison may be varied with the variation of I and may be adapted to the requested error detection probability, and that then, when two different occupancies are predefined for $f = f_1, \ldots, f_I$, e.g. $1, 1, \ldots, 1$ and $0, 0, \ldots, 0$, when different code words are applied at the input of the error-detection circuit FE 25, the outputs $A_1, \ldots, A_I$ in the faultless case take on two different values and are thus at least tested with respect to stuck-at-0 and stuck-at-1 errors at least of the outputs in the continuous faultless operation of the error-correction circuit FKS 23, which is, for example not the case with the outputs of a comparator when realizing doubling and comparison.

It is further advantageous that also several error correction circuits, for example on a chip may be checked by one single error detection circuit by XORing its outputs component by component, as it will be explained in more detail below.

It is illustrated in FIG. 4 that the I outputs $A_1, \ldots, A_I$ of the circuit FE 34 are led into I inputs of an I-digit combinatorial function SFE1 with a controlling value outputting at its output an error signal $e_1$. As a concrete function, in FIG. 3 an NOR gate 36 (realizing a logical not-or-function) with I inputs with a controlling value 1 was selected, so that $e_1 = 1$ applies for $f_1 = f_2 = \ldots = f_I = 0$ and $e_1 = 0$ for $f_1 = f_2 = \ldots = f_I = 1$. If one of the values $i_1, i_2, \ldots, i_I$ is equal to 0, then the corresponding output of the error detection circuit FE 34 is inverted before it is connected to the corresponding input of the NOR gate 35.

FIG. 5 shows how the outputs $A_1, \ldots, A_I$ of the circuit FE 44 are simultaneously connected to the I inputs of a combinatorial circuit SFE1 45 for realizing a Boolean function with a controlling value 1, outputting at its output the error signal $e_1$ and to the I inputs of a combinatorial circuit SFE0 47 for realizing a Boolean function with the controlling value 0, outputting at its output an error signal $e_2$. The combinatorial circuit SFE1 45 and the combinatorial circuit SFE0 47 may realize together an error indication determiner as mentioned above. As concrete circuits, here an NOR gate 46 for the combinatorial circuit SFE1 with the controlling value 1 and an AND gate 48 with an controlling value 0 for the combinatorial circuit SFEO 47 were selected.

It is assumed that $i_1=i_2=\ldots=i_I$. If $f_1=\ldots=f_I=1$ applies, then $e_1=0$ and $e_2=1$, and if $f_1=\ldots=f_I=0$ applies, then $e_1=1$ and $e_2=0$, so that then, when different code words $v_{corr}$ are applied at the input of the circuit FE 44, different values are output for $e_1$ and $e_2$. If not all components of f are equal, then $e_1=e_2$, and an error of the circuit FKS 23 in FIG. 5 which manifests itself as a non-code word $v_{corr}$ is then detected, that $e_1=e_2$ applies.

In FIG. 3 it is illustrated for an embodiment how the partial words $v'^1$ and $v'^2$ are formed at the circuit input of the circuit FKS 23 of FIG. 2, when data bits $u_1, \ldots, u_k$ and check bits $c_1, \ldots, c_m$ form the bits which are corrected by the circuit FKS 23 and when the address bits $a=a_1, \ldots a_r$ under which the bits u and c are stored in a storage are not corrected.

The data bits u and the address bits a form the q information bits $w=w_1, \ldots, w_q$ of the error correction code which was here assumed to be separable, so that from the information bits u and a the check bits c are determined and the information bits are not changed in encoding. The bits u and c are stored under the address a in a storage 51 when writing and when reading again read out under the address a. When writing it is assumed that u, a, c is a code word of the code C. If the data is again read out at the address, it may have changed erroneously, so that generally u', c' are read out which may be different from u, c. Also the address may be formed erroneously, so that instead of the address at the address a' is to be considered. The read-out data u', $c'=v'^1$ is corrected by the error correction circuit FKS 23 in FIG. 2, while the address bits $a'=v'^2$ are not corrected and erroneous address bits lead to a non-code word $v_{corr}=v_{corr}^1$, a' at the input of the error detection circuit FE 25.

In the following, it is explained with respect to examples how a combinatorial circuit FE 25 for error detection may be determined practically.

The error detection circuit FE 25 (error detector), for example, realizes a function $$f^T = L \cdot v^T,$$

wherein L is a (I,n)-matrix and $f^T$ designates the transposed column vector of the row vector $f=(f_1, \ldots, f_I)$. The matrix L (error detection matrix) can be determined, for example, by $$M = K \cdot H = (M_1, \ldots, M_n).$$

wherein H is an (m,n)-H-matrix (check matrix) of the error correction code C and the transformation matrix K is a binary (I,m)-matrix unequal to the zero matrix. The following applies m=n−q, $1 < I \leq m$ and $M_1, \ldots M_n$ are the I-component columns of the matrix M.

The (I,n)-matrix $L=(L_1, L_2, \ldots, L_n)$ with the columns $L_1, \ldots, L_n$ here is determined from a matrix $M=K \cdot H=M_1, M_2, \ldots M_I$, so that for a subset $\{L_{i1}, \ldots, L_{ih}\}$ of h, $h \leq n$, columns these h columns of the matrix L are the corresponding inverted columns of the matrix M. For these h columns of the matrix L the following applies $L_{i1}=\overline{M}_{i1}, L_{i2}=\overline{M}_{i2}, \ldots, L_{ih}=\overline{M}_{ih}$, while for all other I-h columns for $j=h+1, \ldots, n$ $L_{ij}=M_{ij}$ applies, and wherein the column $\overline{M}_{ij}$ is formed from the column $M_{ij}$ of the matrix M by inverting all I components of the column $M_{ij}$.

For example, if h=0, then no column of the matrix M is inverted and $L=K \cdot H$.

In another example, it is possible, that the matrix K is equal to the m-dimensional identity matrix, so that $M=I \cdot H=H$ applies. It is also possible, that the matrix K contains only one single element 1 while all other elements are 0.

To explain the determination of the matrix L in more detail, as an example of an error correction code now a shortened Hamming Code is considered with the (4.9)-H-matrix and with the matrix $K=I_4$ (transformation matrix), wherein $I_4$ is the 4-dimensional identity matrix. In this example M=H with $$M = H = \begin{pmatrix} 1 & 1 & 0 & 1 & 1 & 1 & 0 & 0 & 0 \\ 1 & 0 & 1 & 1 & 0 & 0 & 1 & 0 & 0 \\ 0 & 1 & 1 & 1 & 0 & 0 & 0 & 1 & 0 \\ 0 & 0 & 0 & 0 & 1 & 0 & 0 & 0 & 1 \end{pmatrix}$$

and with the (5,9)-G-matrix G of the code $$G = \begin{pmatrix} 1 & 0 & 0 & 0 & 0 & 1 & 1 & 0 & 0 \\ 0 & 1 & 0 & 0 & 0 & 1 & 0 & 1 & 0 \\ 0 & 0 & 1 & 0 & 0 & 0 & 1 & 1 & 0 \\ 0 & 0 & 0 & 1 & 0 & 1 & 1 & 1 & 0 \\ 0 & 0 & 0 & 0 & 1 & 1 & 0 & 0 & 1 \end{pmatrix}.$$

The code word $v=v_1, \ldots, v_9$ with $v=u \cdot G=u,c$ with the check bits $c=c_1, \ldots, c_4$ is associated with the information bits $u=u_1, \ldots, u_5$, wherein $c_1=u_1 \oplus u_2 \oplus u_4 \oplus u_5$ $c_2=u_1 \oplus u_3 \oplus u_4$ $c_3=u_2 \oplus u_3 \oplus u_4$ $c_4=u_5$ applies. The two words v=110110001 and v'=101100100 are valid code words, as $H \cdot v^T=0$ and $H \cdot v'^T=0$ applies.

h=1 and $M_{i1}=M_2$ are selected. Then, for the second column $L_2$ of the matrix L it applies that $L_2=\overline{M}_2$ and thus $$L = \begin{pmatrix} 1 & 0 & 0 & 1 & 1 & 1 & 0 & 0 & 0 \\ 1 & 1 & 1 & 1 & 0 & 0 & 1 & 0 & 0 \\ 0 & 0 & 1 & 1 & 0 & 0 & 0 & 1 & 0 \\ 0 & 1 & 0 & 0 & 1 & 0 & 0 & 0 & 1 \end{pmatrix}$$

and $L \cdot v^T = f^T = (f_1, f_2, f_3, f_4)^T = (1,1,1,1)^T$ and $L \cdot v'^T = f^T = (f_1, f_2, f_3, f_4)^T = (0,0,0,0)$ The circuit FE 25 simply realizes the binary linear equations $f^T=L \cdot v^T$ i.e.

$f_1=v_1 \oplus v_4 \oplus v_5 \oplus v_6$ $f_2=v_1 \oplus v_2 \oplus v_3 \oplus v_4 \oplus v_7$ $f_3=v_3 \oplus v_4 \oplus v_8$ $f_4=v_2 \oplus v_5 \oplus v_9$ which may for example be implemented with a synthesis tool.

One especially simple variant is obtained for the considered shortened hamming code by selecting M=K·H with $$K = \begin{pmatrix} 1 & 0 & 0 & 0 \\ 0 & 0 & 0 & 0 \\ 0 & 0 & 0 & 0 \\ 0 & 0 & 0 & 0 \end{pmatrix}$$

wherein the matrix K comprises only zeros except of one element 1 and H is the H-matrix of the already described shortened hamming code. Further, M=K·H=(1 1 0 1 1 1 0 0 0)=$M_1, \ldots, M_9$ applies. If here h=2 and $i_1$=2, $i_2$=4 are selected and thus $L_2=\overline{M}_2=0$, $i_2$=4 and thus $L_4=\overline{M}_4=0$, then L=(1 0 0 0 1 0 0 0) and f=$f_1$=L·v=$v_1 \oplus v_5$. For the code word v=(110110001), f=$f_1$=L·v'–0 and for the code word v''=(101100100), f=$f_1$=L·v''=1.

In a further embodiment it may be illustrated how, with a described error detection circuit FE several error correction circuits are to be checked regarding errors simultaneously, which is especially advantageous when several error correction circuits are implemented on the same chip.

FIG. 6 illustrates two error correction circuits FKS 61 (error corrector) and FKS* 62 (second error corrector), wherein the error correction circuit FKS 61 corrects the signal $v'^1$, $v'^2$ in $v_{corr}$, which are applied on the n bit wide signal lines 65 at the first inputs of the n XOR gates 63 (combiner), and wherein the error correction circuit FKS* 62 corrects the signals $\tilde{v}'^1$, $\tilde{v}'^2$, in $\tilde{v}_{corr}$ which are applied on the n bit wide signal lines 66 at the correct position at a respective second input of the n XOR gates 63 and whose n binary outputs are led into the inputs of the error detection circuit FE (error detector). If both $v_{corr}$ and also the $\tilde{v}_{corr}$ are code words of the linear code C, then their XORing component by component is also a code word and an error in one of the code words $v_{corr}$ or $\tilde{v}_{corr}$ have an effect of an error in the bitwise XOR sum, which can be detected by the error detection circuit FE.

In a very similar way, also more than two error correction circuits may be checked with respect to errors, by bitwise XORing the corrected values of the more than two error correction circuits and then checking by the error detection circuit FE whether the values applied to the same form a code word. It may then be detected if an error correction circuit is erroneous.

Likewise, it is also possible, as illustrated in FIG. 7, to check the code words generated by an encoder 71 (coder) with the error detection circuit FE, as illustrated in FIG. 7. The outputs 74 of the encoder 71 are connected to the inputs 76 of the error detection circuit FE 77 via the first n bit wide input of a multiplexer 75, to the second n bit wide input of which the lines 73 carrying corrected signals $v_{corr}$ corrected by the at least one error correction circuit FKS 72 are applied. Here, it is assumed that the output signals of the coder 71 and the error correction circuit 72 are provided at different times, so that the multiplexer relays the same to the error detection circuit 77 at times, the output signals are provided.

The encoder 71 is implemented such that it forms the associated code word v=w·G from the information bits $w_1, \ldots, w_q$, wherein G is the G-matrix of the code C. The error correction circuit FKS 72 corrects the bits $v'^1$ in $v_{corr}^1$ forming the word $v_{corr}$ together with the non-corrected bits $v'^2$.

Apart from this, it may be advantageous to connect the outputs of a code via XOR gates to the outputs of an error correction circuit, so that the outputs of the XOR gates are connected to the inputs of the error detection circuit FE via XOR gates.

Likewise, it may be advantageous, to connect several n-bit wide lines, which exist on a chip and carry respectively simultaneously or at different times code words of the code C, so that in the faultless case the connecting lines carry also code words of the code C and that the n bit wide lines carry no code word of the code, if one of the n bit wide connecting lines carry no code word and the connecting lines are connected with the inputs of a described error detection circuit.

Some embodiments relate to a circuitry for error detection. It relates to the improvement of error detection in electrical circuits and is, for example, applicable in the detection of errors in circuits for error correction of data encoded with error correction codes.

The proposed concept may provide a circuitry and/or a method enabling an error detection of errors in an error correction circuit which is simple and/or cost-efficient.

Some embodiments relate to a circuitry S for detecting errors in a circuit for correcting errors in code words of a linear error correction code C, comprising an error correction circuit FKS. The error correction circuit FKS comprises n binary inputs for the input of an n-component binary word $v'=v'_1, \ldots, v'_n$, consisting of two bit groups $v'^1=v'_1, \ldots, v'_p$ and $v'^2=v'_{p+1}, \ldots, v'_n$ and p outputs for outputting p corrected bits of the first bit group $v_{corr}^1=c_{corr,1}, \ldots, v_{corr,p}$, wherein 1≤p≤n applies.

The linear code consists of code words v=$v_1, \ldots, v_n$=$v^1, v^2$ of the length n with q, q<n information bits, wherein the code words consist of a first group of bits $v^1=v_1, \ldots, v_p$ and a second group of bits $v^2=v_{p+1}, \ldots, v_n$, wherein errors in the first group of bits are corrected by the error correction circuit FKS in $v_{corr}^1$ and errors in the second bit group of bits are not corrected, and wherein the bits $v_{corr}^1$ of the first bit group corrected by the error correction circuit FKS and the non-corrected bits $u'^2$ of the second bit group form the n-digit binary word $v_{corr}=v_{corr}^1, v'^2$.

The error correction circuit FKS is set up so that when inputting a code word v ∈ C, $v_{corr}$=v applies, when the error correction circuit FKS is not erroneous.

An error detection circuit FE with n binary inputs and l binary outputs $A_1, \ldots, A_l$ for outputting an l-component error signal $f_1 \ldots, f_l$ exists, which forms the error signal f=$f_1 \ldots, f_l$ for l determined binary values $i_1, i_2 \ldots i_l$ so that for an input of any code word $v_{corr}$ of the code C for the components of the error signal $$f_1^{i_1}=f_2^{i_2}=\ldots=f_l^{i_l}$$

applies, and when inputting a non-code word $v_{corr}$ not all components $f_1^{i_1}, f_2^{i_2}, \ldots, f_l^{i_l}$ of the components of the error signal are equal and the error detection circuit indicates an error when not all values of the components $f_1^{i_1}, f_2^{i_2}, \ldots, f_l^{i_l}$ of the error signal f are equal and l≤n−q applies, and wherein $f_j^{i_j}=\bar{f}_j$ for j=1, …, l applies, if $i_j$=0 applies, and $f_j^{i_j}=f_j$, if $i_j$=1 applies.

According to an aspect, $i_1=i_2=, \ldots, =i_l$ and $f_1^{i_1}=f_1, f_2^{i_2}=f_2, \ldots, f_l^{i_l}=f_l$ applies.

Further, there may be a code word $v_{corr}$ of the code C, so that $f_1=f_2=\ldots=f_l$=0 and there is a further code word $v'_{corr}$ of the code C, so that $f_1=f_2=\ldots=f_l$=1

According to a further embodiment, the error detection circuit FE 24 forms the error signal f according to the relation $$f^T = L \cdot v_{corr}^T,$$

wherein L is an (l,n)-matrix with binary elements, $v^T$ designates the transposed column vector of the line vector v and $f^T$ designates the transposed column vector of the row vector f=$f_1, \ldots, f_l$ and $f_1=f_2=\ldots=f_l$ applies, when $v_{corr}$ is a code word of the code C and for (at least) a non-code word $v_{corr}$ it applies that not all components $f_1=f_2=\ldots=f_I$ of f are equal and the error correction circuit FE indicates an error when not all components are equal.

Further, the circuit outputs $A_1, \ldots, A_I$ of the circuit FE may be led into I inputs of a first combinatorial circuit SFE1 for realizing a Boolean function with a controlling value outputting a binary error signal $e_1$ at its 1-bit wide output.

According to another aspect, the circuit outputs $A_1, \ldots, A_I$ of the circuit FE are connected to a first combinatorial circuit SFE1 for realizing a I digit Boolean function with the controlling value 1 and the I inputs of a second combinatorial circuit SFE2 for realizing a further Boolean function with the controlling value 0, wherein the circuit SFE1 outputs a binary error signal $e_1$ and the circuit SFE2 outputs a binary error signal $e_2$.

Further, the (I,n) matrix L may be determined by $$L = K \cdot H$$

wherein H is an (m,n) H-matrix of the error correcting linear code C and K is a binary (I,m)-matrix unequal the zero matrix and m=n−q and I≤m.

Alternatively, I=m and K is an (m,m)-identity matrix, for example.

According to a further aspect, the (I,n)-matrix $L=(L_1, L_2 \ldots, L_1)$ is determined from a matrix $(M=K \cdot H=M_1, M_2, \ldots M_1)$, that for a subset $\{L_{i1}, \ldots, L_{ih}\}$ of h, h≤I, columns of the matrix L i.e $L_{i1}=\overline{M}_{i1}, L_{i2}=\overline{M}_{i2}, \ldots, L_{ih}=\overline{M}_{ih}$ applies, while for all other I-h columns for j=h+1, ..., I $L_{ij}=M_{ij}$ applies, and wherein the column $\overline{M}_{ij}$ is formed from the column $M_{ij}$ of the matrix M, wherein all I components of the column $M_{ij}$ are inverted. For example, h=1.

Further, the first bit group $v^1=u,c$ and the second bit group $v^2=a$ of the code words of the error corrected code C may consist of a bit group $u=u_1, \ldots, u_k$ of k bits, a bit group $c=c_1, \ldots, c_m$ of m bits and a bit group a of r bits $a=a_1, \ldots, a_r$, wherein k+r+m=n applies, wherein u are the data bits and a the address bits and u and a form the information bits of the error correction code C and c the check bits of the error correction code C, wherein the check bits c are determined from (u, a) and the data bits u and the check bits c are stored under the address a in a storage.

For example, the data bits u and the check bits c are the bits which are corrected. Alternatively, all n bits may be corrected and $v^1=v_1^1 \ldots, v_n^1$ includes all n bits und $v^2$ includes no bits.

Further, apart from the error correction circuit FKS at least one further error correction circuit FKS* may exist, wherein each of the n circuit outputs of the error correction circuit FKS is led into the first input of an XOR gate, at least comprising one further input. At this at least one further input at the right position a corresponding output line of the further error correction circuit FKS* is connected and the output of the XOR gate is connected at the right position to the corresponding input of the error detection circuit FE.

Alternatively or additionally, apart from the at least one error correction circuit FKS also at least one circuit for data encoding DK (coder) of information bits into code words $v=v_1, \ldots, v_n$ of the code C exists and the output lines carrying the bits $v_1, \ldots, v_n$ of the circuit for data encoding DK are connected at the right position to the inputs of the error detection circuit FE.

In general, an error corrector, an error detector, a combiner, a coder, an error indication determiner, a means for correcting a bit error and/or a means for determining an error detection bit sequence as described above may be an independent hardware unit or part of a computer, a microcontroller or a digital signal processor as well as a computer program or software product for running on a computer, a microcontroller or a digital signal processor.

Further, an error corrector, an error detector, a combiner, a coder, an error indication determiner, a means for correcting a bit error and/or a means for determining an error detection bit sequence as described above, may be implemented independently from each other or at least partly together. For this, for example, the functionality of two or more of these units may be at least partly united to a combined hardware unit or a software unit by a synthesis tool.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments comprise a data carrier having electronically readable control signals, which are capable of cooperating with a programmable computer system, such that one of the methods described herein is performed.

Generally, embodiments can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles described. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although some dependent claims only relate to one other claim, also a combination with one or more further dependent or different independent claims may be possible. Further, also different independent claims may be combined.

The invention claimed is:

1. Apparatus for detecting a faulty behavior of an error corrector due to a transient or permanent hardware error, comprising:
the error corrector configured to correct a correctable bit error within at least a faulty subset of bits of a faulty coded binary word coded by an error correction code and to output the coded binary word in which the correctable bit error is corrected; and
an error detector configured to receive an error detector input binary word based on at least an output of the error corrector, and determine an error detection bit sequence indicating whether or not the error detector input binary word is a code word of the error correction code;
wherein the apparatus is configured to detect the faulty behavior of the error corrector in case the error detection bit sequence indicates that the error detector input binary word is not a code word of the error correction code even though a code word of the error correction code or a faulty word which is correctable by the error correction code is input into the error corrector, and
wherein the error detector is configured to determine the error detection bit sequence, so that the error detection bit sequence is equal to a first predefined detection bit sequence for a first subset of code words of the error correction code and equal to a second predefined detection bit sequence for a second subset of code words of the error correction code, wherein the first predefined detection bit sequence is different from the second predefined detection bit sequence and the first subset of code words of the error correction code is different from the second subset of code words of the error correction code.

2. The apparatus according to claim 1, wherein the error correction code comprises a number of check bits, and wherein the error detection bit sequence comprises less bits than the number of check bits of the error correction code.

3. The apparatus according to claim 1, wherein the error detection bit sequence is unequal to the first predefined detection bit sequence and the second predefined detection bit sequence, if the output of the error corrector is not a code word of the error correction code.

4. The apparatus according to claim 1, wherein the bits of the first predefined detection bit sequence are all 0 and the bits of the second predefined detection bit sequence are all 1.

5. The apparatus according to claim 1, wherein the coded binary word coded by the error correction code comprises a first proper subset of bits and a second proper subset of bits, wherein the error corrector is configured to correct a correctable bit error within the first proper subset of bits and wherein the error detector input binary word is based on the output of the error corrector and the second proper subset.

6. The apparatus according to claim 1, wherein the error corrector is configured to correct a correctable bit error within all bits of the coded binary word, wherein the error detector input binary word is based on the output of the error corrector only.

7. An apparatus for detecting a faulty behavior of an error corrector due to a transient or permanent hardware error, comprising:
the error corrector configured to correct a correctable bit error within at least a faulty subset of bits of a faulty coded binary word coded by an error correction code and to output the coded binary word in which the correctable bit error is corrected; and
an error detector configured to receive an error detector input binary word based on at least an output of the error corrector, and determine an error detection bit sequence indicating whether or not the error detector input binary word is a code word of the error correction code;
wherein the apparatus is configured to detect the faulty behavior of the error corrector in case the error detection bit sequence indicates that the error detector input binary word is not a code word of the error correction code even though a code word of the error correction code or a faulty word which is correctable by the error correction code is input into the error corrector, and
wherein the error detector is configured to determine the error detection bit sequence based on a multiplication of an error detection matrix and the error detector input binary word, wherein the error detection matrix is based on a check matrix of the error correction code.

8. The apparatus according to claim 7, wherein the error detection matrix comprises less rows than the check matrix or less columns than the check matrix.

9. The apparatus according to claim 7, wherein the error detection matrix comprises at least one column or at least one row derived by inverting at least one element of a corresponding column or at least one element of a corresponding row of the check matrix or by inverting at least one element of a corresponding column or at least one element of a corresponding row of a matrix resulting from a multiplication of a transformation matrix and the check matrix.

10. The apparatus according to claim 1, wherein the error correction code is a linear error correction code.

11. An apparatus for detecting a faulty behavior of an error corrector due to a transient or permanent hardware error, comprising:
the error corrector configured to correct a correctable bit error within at least a faulty subset of bits of a faulty coded binary word coded by an error correction code and to output the coded binary word in which the correctable bit error is corrected; and
an error detector configured to receive an error detector input binary word based on at least an output of the error corrector, and determine an error detection bit sequence indicating whether or not the error detector input binary word is a code word of the error correction code;
wherein the apparatus is configured to detect the faulty behavior of the error corrector in case the error detection bit sequence indicates that the error detector input binary word is not a code word of the error correction code even though a code word of the error correction code or a faulty word which is correctable by the error correction code is input into the error corrector, and
wherein the coded binary word comprises data bits, check bits of the error correction code and address bits, wherein the error corrector is configured to correct a correctable bit error within the data bits and the check bits only, wherein the corrected coded binary word is based on the output of the error corrector and the address bits of the coded binary word.

12. The apparatus according to claim 11, further comprising an addressable storage, wherein the data bits and the check bits are stored at an address of the addressable storage indicated by the address bits, wherein the address bits indicated the write address in a write operation and indicate the read address in a read operation, and wherein the check bits are determined by the data bits and the address bits.

13. An apparatus for detecting a faulty behavior of an error corrector due to a transient or permanent hardware error, comprising:
the error corrector configured to correct a correctable bit error within at least a faulty subset of bits of a faulty coded binary word coded by an error correction code and to output the coded binary word in which the correctable bit error is corrected;
an error detector configured to receive an error detector input binary word based on at least an output of the error corrector, and determine an error detection bit sequence indicating whether or not the error detector input binary word is a code word of the error correction code;
wherein the apparatus is configured to detect the faulty behavior of the error corrector in case the error detection bit sequence indicates that the error detector input binary word is not a code word of the error correction code even though a code word of the error correction code or a faulty word which is correctable by the error correction code is input into the error corrector; and
a combiner configured to determine the error detector input binary word by combining a coded binary word which is based the output of the error corrector and a second coded binary word, so that the error detector input binary word is a code word of the same error correction code if the corrected coded binary word and the second coded binary word are code words of the error correction code, and so that the error detector input binary word is not a code word of the error correction code if the corrected coded binary word or the second coded binary word is not a code word of the error correction code.

14. The apparatus according to claim 13, further comprising a second error corrector configured to correct a correctable bit error within at least a subset of bits of a coded binary word coded by the error correction code, wherein the second coded binary word contains the output of a second error corrector.

15. The apparatus according to claim 13, further comprising a coder configured to encode a binary word according to the error correction code to obtain the coded binary word input into the second error corrector.

16. The apparatus according to claim 13, wherein the combiner is configured to combine the corrected coded binary word and the second coded binary word by a bitwise logical XOR function to obtain the error detector input binary word.

17. The apparatus according to claim 1, further comprising an error indication determiner configured to determine, based on the error detection bit sequence an error indication bit sequence, indicating whether or not an error within the error detector input binary word is detected, wherein the error indication bit sequence comprises one bit if only one possible value of the error detection bit sequence is obtainable for all code words of the error correction code, or the error indication bit sequence comprises two bits if at least two different possible values of the error detection bit sequence are obtainable for different code words of the error correction code.

18. An error detector configured to determine an error detection bit sequence indicating whether or not an error detector input binary word is a code word of a linear error correction code, wherein the error detector is configured to determine the error detection bit sequence by multiplying the error detector input binary word by an error detection matrix, wherein the error detection matrix is defined as the product of a check matrix of the linear error correction code and a binary transformation matrix, wherein the error detection matrix comprises less rows than the check matrix of the linear error correction code and the same number of columns as the check matrix of the linear error correction code, wherein the binary transformation matrix is a binary matrix not equal to the zero matrix, which has less rows than the check matrix of the linear error correction code, wherein the number of columns of the binary transformation matrix corresponds to the number of rows of the check matrix of the linear error correction code.

19. An error detector configured to determine an error detection bit sequence indicating whether or not an error detector input binary word is a code word of an error correction code, wherein the error detector is configured to determine the error detection bit sequence based on a multiplication of an error detection matrix and the error detection input binary word, wherein the error detection matrix is based on a check matrix of the error correction code, wherein the error detection matrix comprises at least one column or at least one row derived by
a) inverting at least one element of a corresponding column or at least one element of a corresponding row of the check matrix or by inverting at least one element of a corresponding column or at least one element of a corresponding row of a matrix resulting from a multiplication of a transformation matrix and the check matrix, and
b) replacing the corresponding column or row of the check matrix or of the matrix resulting from a multiplication of a transformation matrix and the check matrix by the column or row, in which the at least one element is inverted.

20. A circuitry S for detecting errors in a circuit for correcting errors in code words of a linear error correction code C, comprising:
an error correction circuit, wherein the error correction circuit comprises n binary inputs for the input of an n-component binary word $v'=v'_1, \ldots, v'_n$, comprising two bit groups $v'^1=v'_1, \ldots, v'_p$ and $v'^2=v'_{p+1}, \ldots, v'_n$ and p outputs for outputting p corrected bits of the first bit group $v_{corr}^1=v_{corr,1}, \ldots, v_{corr,p}$, wherein $1 \leq p \leq n$ applies,
wherein the linear error correction code comprises code words $v=v_1, \ldots, v_n=v^1, v^2$ of the length n with q, q<n information bits, wherein the code words comprise a first group of bits $v^1=v_1, \ldots, v_p$ and a second group of bits $v^2=v_{p+1}, \ldots, v_n$, wherein errors in the first group of bits are corrected by the error correction circuit in $v_{corr}^1$ and errors in the second bit group of bits are not corrected, and wherein the bits $v_{corr}^1$ of the first bit group corrected by the error correction circuit and the non-corrected bits $v^2$ of the second bit group form the n-digit binary word $v_{corr}=v_{corr}^1, v^2$, wherein $v_{corr}^1$ is output by the error correction circuit,
wherein the error correction circuit is set up so that when inputting a code word $v \in C$, $v_{corr}=v$ applies, when the error correction circuit is not erroneous; and
an error detection circuit with n binary inputs and I binary outputs $A_1, \ldots, A_I$, and configured to output an I-component error signal $f_1 \ldots, f_I$ exists, which forms the error signal $f=f_1 \ldots, f_I$ for I determined binary values $i_1, i_2 \ldots i_I$ so that for an input of any code word $v_{corr}$ of the code C for the components of the error signal $$f_1^{i1}=f_2^{i2}=\ldots=f_I^{iI}$$

applies, and configured to input a non-code word $v_{corr}$, not all components $f_1^{i1}, f_2^{i2}, \ldots, f_I^{iI}$ of the components of the error signal are equal and the error detection circuit indicates an error when not all values of the components $f_1^{i1}, f_2^{i2}, \ldots, f_I^{iI}$ of the error signal f are equal and $I \leq n-q$ applies, and wherein $f_j^{ij}=\bar{f}_j$ for j=1, ..., I applies, if $i_j=0$ applies, and $f_j^{ij}=f_j$, $i_j=1$ applies, wherein the n binary inputs of the error detection circuit are arranged to receive an input based on the n-digit binary word $v_{corr}=v_{corr}^1, v^{'2}$, wherein $v_{corr}^1$ is output by the error correction circuit.

21. A method for detecting a faulty behavior of an error corrector due to a transient or permanent hardware, the method comprising:

inputting a code word of an error corrections code or a faulty word which is correctable by the error correction code into an error corrector configured to correct a correctable bit error within at least a subset of bits of a coded binary word coded by the error correction code and to output the coded binary word in which the correctable bit error is corrected;

determining using an error detector an error detection bit sequence indicating whether or not an error detector input binary word is a code word of the error correction code, wherein the error detector input binary word is based on at least an output of the error corrector received at the error detector; and detecting the faulty behavior of the error corrector in case the error detection bit sequence indicated that the error detector input binary word is not a code word of the error correction code even though the code word of the error correction code or the faulty word which is correctable by the error correction code was input to the error corrector, wherein the error detection bit sequence is determined using the error detector so that the error detection bit sequence is equal to a first predefined detection bit sequence for a first subset of code words of the error correction code and equal to a second predefined detection bit sequence for a second subset of code words of the error correction code, wherein the first predefined detection bit sequence is different from the second predefined detection bit sequence and the first subset of code words of the error correction code is different from the second subset of code words of the error correction code.

22. The circuitry of claim 20, wherein the second group of bits comprises address bits.

23. The circuitry of claim 20, further comprising an addressable storage, wherein the bits of the first group of bits are stored at an address of the addressable storage indicated by the address bits of the second group of bits.

24. The circuitry of claim 20, further comprising a combiner configured to determine the binary inputs of the error detection circuit by combining a coded binary word which is based on the output of the error correction circuit and a second coded binary word, so that the binary inputs of the error detection circuit is a code word of the same error correction code if the corrected coded binary word and the second coded binary word are code words of the error correction code, and so that the error detector input binary word is not a code word of the error correction code if the corrected coded binary word or the second coded binary word is not a code word of the error correction code.

* * * * *